United States Patent
Sumi et al.

(10) Patent No.: US 11,374,162 B2
(45) Date of Patent: Jun. 28, 2022

(54) PIEZOELECTRIC ELEMENT, METHOD FOR MANUFACTURING THE SAME, AND PIEZOELECTRIC ELEMENT-APPLIED DEVICE

(71) Applicant: Seiko Epson Corporation, Tokyo (JP)

(72) Inventors: Koji Sumi, Shiojiri (JP); Tomokazu Kobayashi, Shiojiri (JP); Tomohiro Sakai, Matsumoto (JP); Kazuya Kitada, Suwa (JP); Koichi Morozumi, Shiojiri (JP); Tsutomu Asakawa, Shiojiri (JP)

(73) Assignee: Seiko Epson Corporation

( * ) Notice: Subject to any disclaimer, the term of this patent is extended or adjusted under 35 U.S.C. 154(b) by 1023 days.

(21) Appl. No.: 16/031,017

(22) Filed: Jul. 10, 2018

(65) Prior Publication Data
US 2019/0019941 A1  Jan. 17, 2019

(30) Foreign Application Priority Data
Jul. 11, 2017 (JP) .............................. JP2017-135407

(51) Int. Cl.
*H01L 41/09* (2006.01)
*H01L 41/29* (2013.01)
*H01L 41/047* (2006.01)
*H01L 41/187* (2006.01)
(Continued)

(52) U.S. Cl.
CPC ...... *H01L 41/1873* (2013.01); *B41J 2/14201* (2013.01); *H01L 41/0477* (2013.01); *H01L 41/0973* (2013.01); *H01L 41/29* (2013.01); *H01L 41/317* (2013.01)

(58) Field of Classification Search
CPC ... H01L 41/29; H01L 41/317; H01L 41/0477; H01L 41/0973; H01L 41/1873; B41J 2/14201
See application file for complete search history.

(56) References Cited

U.S. PATENT DOCUMENTS

| | | |
|---|---|---|
| 2007/0001553 A1 | 1/2007 | Kawada et al. |
| 2007/0236104 A1 | 10/2007 | Fujii |
| 2009/0160914 A1 | 6/2009 | Fujii |

(Continued)

FOREIGN PATENT DOCUMENTS

| | | |
|---|---|---|
| JP | 2007-281238 A | 10/2007 |
| JP | 2014-036035 A | 2/2014 |

(Continued)

OTHER PUBLICATIONS

S. Wiegand et al.., "Influence of Different Heat Treatment Programs on Properties of SOL-GEL Syntehsized $(Na_{0.5}K_{0.5})NbO_3$ (KNN) Thin Films", Indian Academy of Sciences, Bull. Mater. Sci., vol. 35, No. 5, Oct. 2012, pp. 745-750.

(Continued)

*Primary Examiner* — Shawki S Ismail
*Assistant Examiner* — Monica Mata
(74) *Attorney, Agent, or Firm* — Harness, Dickey & Pierce, P.L.C.

(57) ABSTRACT

A piezoelectric element includes a first electrode; a piezoelectric layer, placed on or above the first electrode, containing potassium, sodium, niobium, titanium, and oxygen; and a second electrode placed on or above the piezoelectric layer.

16 Claims, 15 Drawing Sheets

(51) Int. Cl.
*H01L 41/317* (2013.01)
*B41J 2/14* (2006.01)

(56) References Cited

U.S. PATENT DOCUMENTS

| | | | |
|---|---|---|---|
| 2011/0175488 A1* | 7/2011 | Shibata | H01L 41/094 |
| | | | 310/319 |
| 2014/0042875 A1 | 2/2014 | Suenaga et al. | |
| 2014/0049138 A1* | 2/2014 | Shiraki | C23C 18/1216 |
| | | | 310/330 |
| 2015/0002584 A1 | 1/2015 | Sumi et al. | |
| 2015/0194594 A1 | 7/2015 | Murakami et al. | |
| 2015/0229290 A1 | 8/2015 | Suenaga et al. | |
| 2016/0276572 A1 | 9/2016 | Sumi et al. | |
| 2016/0284969 A1 | 9/2016 | Sumi et al. | |
| 2017/0062693 A1 | 3/2017 | Sakai et al. | |
| 2017/0062697 A1 | 3/2017 | Sakai et al. | |
| 2017/0345994 A1 | 11/2017 | Kitada et al. | |

FOREIGN PATENT DOCUMENTS

| | | |
|---|---|---|
| JP | 2015-153850 A | 8/2015 |
| JP | 2016-178253 A | 10/2016 |
| JP | 2016-187019 A | 10/2016 |
| JP | 2016-192511 A | 11/2016 |
| JP | 2016-225422 A | 12/2016 |
| JP | 2016-225550 A | 12/2016 |
| JP | 2017-050353 A | 3/2017 |

OTHER PUBLICATIONS

Extended European Search Report for Application No. EP 18 18 2996 dated Dec. 19, 2018 (6 pages).

L. Chen et al., "Structural, Dielectric, Ferroelectric and Piezoresponse Force Microscopy Characterizations of Bilayered $Bi_{0.9}Dy_{0.1}FeO_3/K_{0.5}Na_{0.5}NbO_3$ Lead-Free Multiferroic Films", Journal of Applied Physics, American Institute of Physics, 2012, vol. 112, pp. 052008-1-052008-6.

\* cited by examiner

|  | U-VALUE [%] | LEAKAGE CURRENT DENSITY [A/cm²] |
|---|---|---|
| EXAMPLE 1 | 130 | 8.00E-07 |
| EXAMPLE 2 | 80 | 1.35E-07 |
| EXAMPLE 3 | 70 | 4.85E-08 |
| EXAMPLE 4 | 200 | 3.00E-06 |
| EXAMPLE 5 | 180 | 2.00E-06 |

FIG. 23

| | HEAT TREATMENT TEMPERATURE [°C] | U-VALUE [%] | LEAKAGE CURRENT DENSITY [A/cm$^2$] |
|---|---|---|---|
| EXAMPLE 6 | 600 | 200 | 3.0E-06 |
| EXAMPLE 7 | 650 | 140 | 1.0E-06 |
| EXAMPLE 8 | 700 | 50 | 1.0E-07 |
| EXAMPLE 9 | 750 | 120 | 8.0E-07 |
| EXAMPLE 10 | 800 | 300 | 1.0E-05 |
| EXAMPLE 11 | NOT HEAT-TREATED | 250 | 1.0E-04 |

PIEZOELECTRIC ELEMENT, METHOD FOR MANUFACTURING THE SAME, AND PIEZOELECTRIC ELEMENT-APPLIED DEVICE

This application claims priority under 35 U.S.C. § 119 to Japanese Patent Application No. 2017-135407 filed on Jul. 11, 2017, the entire disclosure of which is expressly incorporated by reference herein.

BACKGROUND

1. Technical Field

The present invention relates to a piezoelectric element, a method for manufacturing the same, and a piezoelectric element-applied device.

2. Related Art

In general, a piezoelectric element includes a piezoelectric layer having electromechanical transduction properties and two electrodes sandwiching the piezoelectric layer. In recent years, devices (piezoelectric element-applied devices) using such a piezoelectric element as a driving source have been under active development. Examples of a piezoelectric element-applied device include liquid ejecting heads typified by ink jet recording heads, microelectromechanical system (MEMS) components typified by piezoelectric MEMS elements, ultrasonic measurement systems typified by ultrasonic sensors, and piezoelectric actuators.

Lead zirconate titanate (PZT) is known as a material (piezoelectric material) for the piezoelectric layers of the piezoelectric element. From the viewpoint of reducing the impact on the environment, lead-free piezoelectric materials with little lead content are under development. For example, JP-A-2014-36035 proposes a KNN piezoelectric mainly containing potassium sodium niobate ((K, Na)NbO$_3$, or KNN), which is one of the lead-free piezoelectric materials.

However, a piezoelectric element including a KNN piezoelectric layer has a problem that the leakage current is large.

SUMMARY

An advantage of some aspects of the invention is to provide a piezoelectric element with low leakage current. Another advantage of some aspects of the invention is to provide a method for manufacturing a piezoelectric element with low leakage current. Another advantage of some aspects of the invention is to provide a piezoelectric element-applied device including the piezoelectric element.

The invention has been made for the purpose of solving at least one portion of the problem and can be embodied in forms below.

A piezoelectric element according to a first aspect of the invention includes a first electrode; a piezoelectric layer, placed on or above the first electrode, containing potassium, sodium, niobium, titanium, and oxygen; and a second electrode placed on or above the piezoelectric layer.

In the piezoelectric element, the leakage current is smaller as compared to the case where a piezoelectric layer does not contain titanium but contains potassium, sodium, niobium, and oxygen (for details, refer to "3. Experiment examples" below).

In the description of the invention, the term "on or above" is used on the basis that, for example, the expression "a specific thing (hereinafter referred to as "A") is formed on or above another specific thing (hereinafter referred to as "B") includes the case where A is formed directly on B and the case where A is formed above B with another thing therebetween.

In the piezoelectric element, the density of a leakage current may be $1 \times 10^{-6}$ A/cm$^2$ or less when an electric field with an intensity of 200 kV/cm is applied to the piezoelectric layer.

In the piezoelectric element, the reduction of an effective potential due to a leakage current can be reliably suppressed. Furthermore, heat generation by a leakage current and breakage by heat generation can be reliably suppressed.

In the piezoelectric element, the unevenness of titanium in the piezoelectric layer is indicated by a U-value and the U-value may be 140% or less and may satisfy the following formula:

$$U = \{2 \times (I_{MAX} - I_{MIN})/(I_{MAX} + I_{MIN})\} \times 100$$

where $I_{MAX}$ is the maximum intensity of a signal from the titanium in a predetermined zone of the piezoelectric layer as analyzed from the second electrode side in a depth direction by secondary ion mass spectroscopy and $I_{MIN}$ is the minimum intensity of the signal from the titanium in the predetermined zone of the piezoelectric layer as analyzed from the second electrode side in the depth direction by secondary ion mass spectroscopy.

In the piezoelectric element, the density of a leakage current (leakage current density) can be lowered to $1 \times 10^{-6}$ A/cm$^2$ or less (for details, refer to "3. Experiment examples" below).

In the piezoelectric element, the composition of the potassium, sodium, niobium, and oxygen in the piezoelectric layer may satisfy the following formula:

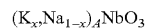

$$(K_x, Na_{1-x})_A NbO_3$$

where $0.1 \leq x \leq 0.9$ and $0.85 \leq A \leq 1.15$.

Even if the composition ration of potassium or sodium shifts from the stoichiometric composition of a perovskite structure, the piezoelectric element is capable of having good characteristics.

In the piezoelectric element, the piezoelectric layer contains lithium and the content of the lithium may be 20% by mole or less with respect to the sum of the number of moles of the potassium and that of the sodium.

In the piezoelectric element, for example, the leakage current is smaller as compared to the case where a piezoelectric layer contains no lithium. Furthermore, characteristics derived from KNN can be more sufficiently exhibited as compared to the case where the content of the lithium is more than 20% by mole with respect to the sum of the number of moles of the potassium and that of the sodium.

A method for manufacturing a piezoelectric element according to a second aspect of the invention includes forming a first electrode; forming a piezoelectric layer containing potassium, sodium, niobium, titanium, and oxygen on or above the first electrode; and forming a second electrode on or above the piezoelectric layer.

By the method, the piezoelectric element can be manufactured so as to have low leakage current.

The method may further includes forming a layer containing titanium before forming the first electrode and heat-treating the layer containing titanium at a temperature of 650° C. to 750° C. after forming the first electrode and before forming the piezoelectric layer. In the method, forming the piezoelectric layer may include firing.

In the method, titanium can be evenly diffused into the piezoelectric layer (for details, refer to "3. Experiment examples" below).

A piezoelectric element-applied device according to a third aspect of the invention includes the piezoelectric element according to the first aspect.

In the piezoelectric element-applied device, the piezoelectric element is capable of having low leakage current.

BRIEF DESCRIPTION OF THE DRAWINGS

The invention will be described with reference to the accompanying drawings, wherein like numbers reference like elements.

FIG. 23 is a table showing heat treatment temperatures, U-values, and leakage current densities.

DESCRIPTION OF EXEMPLARY EMBODIMENTS

Preferred embodiments of the invention will now be described in detail with reference to the accompanying drawings. The embodiments below do not unreasonably limit the scope of the invention as recited in the claims. All of configurations below are not necessarily essential elements of the invention.

1. PIEZOELECTRIC ELEMENT-APPLIED DEVICE

1.1. Configuration

Figure 1:
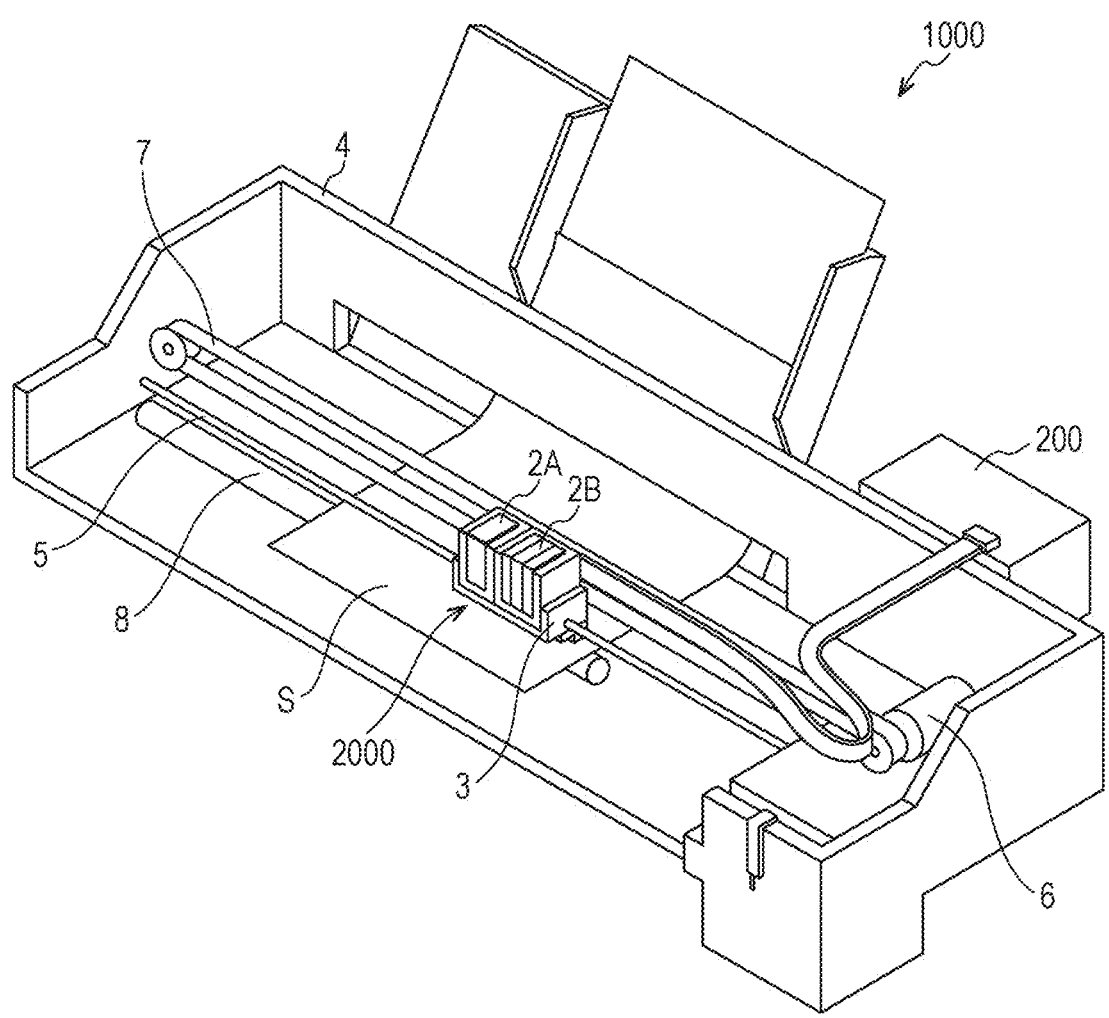
FIG. 1 is a schematic perspective view of an ink jet recording apparatus according to an embodiment of the invention.

A piezoelectric element-applied device according to an embodiment of the invention is described below with reference to FIG. 1. FIG. 1 is a schematic perspective view of an ink jet recording apparatus 1000 that is an example of a liquid ejecting apparatus including a recording head that is the piezoelectric element-applied device.

As shown in FIG. 1, the ink jet recording apparatus 1000 includes an ink jet recording head unit (head unit) 2000 including a plurality of ink jet recording heads. The head unit 2000 is provided with cartridges 2A and 2B, detachably attached thereto, making up an ink supply unit. The head unit 2000 is mounted on a cartridge 3. The cartridge 3 is attached to a carriage shaft 5 attached to an apparatus body 4 so as to be movable in axial directions of the carriage shaft 5. The head unit 2000 ejects, for example, a black ink composition and a color ink composition.

In the ink jet recording apparatus 1000, the driving force of a driving motor 6 is transmitted to the carriage 3 through a plurality of gears, which are not shown, and a timing belt 7, whereby the carriage 3, on which the head unit 2000 is mounted, is moved along the carriage shaft 5. The apparatus body 4 is provided with a transport roller 8 serving as a transport unit. A recording sheet S which is a recording medium such as paper is transported with the transport roller 8. A transport unit transporting the recording sheet S is not limited to the transport roller 8 and may be a belt, a drum, or the like.

The ink jet recording apparatus 1000 includes the ink jet recording heads (hereinafter also simply referred to as the "recording heads") and therefore can be manufactured at low cost. A piezoelectric element below is used and the enhancement of displacement characteristics of the piezoelectric element, which makes up a piezoelectric actuator, is expected; hence, ejection characteristics can be enhanced.

Figure 2:
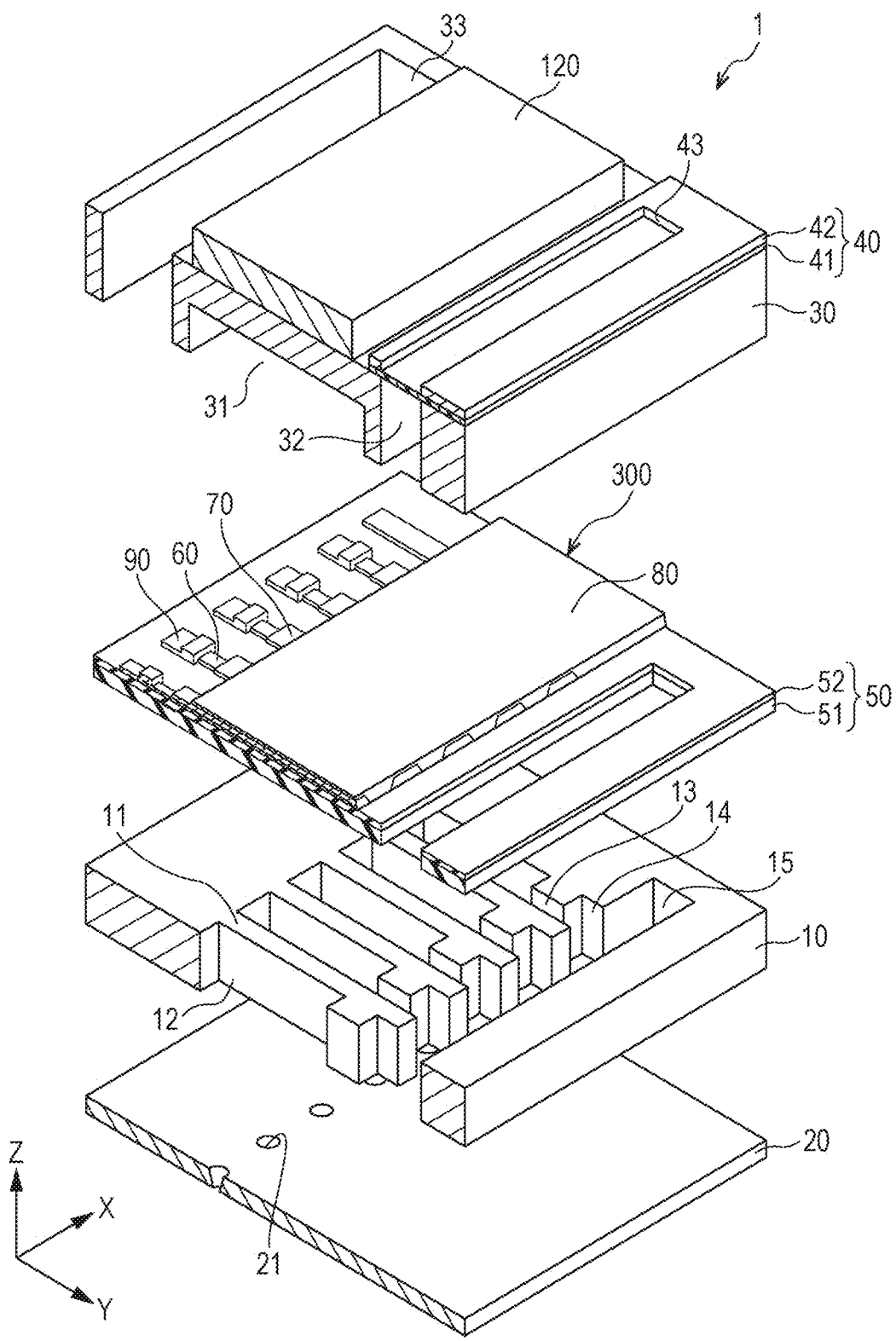
FIG. 2 is a schematic exploded perspective view of a recording head included in the ink jet recording apparatus.
Figure 3:
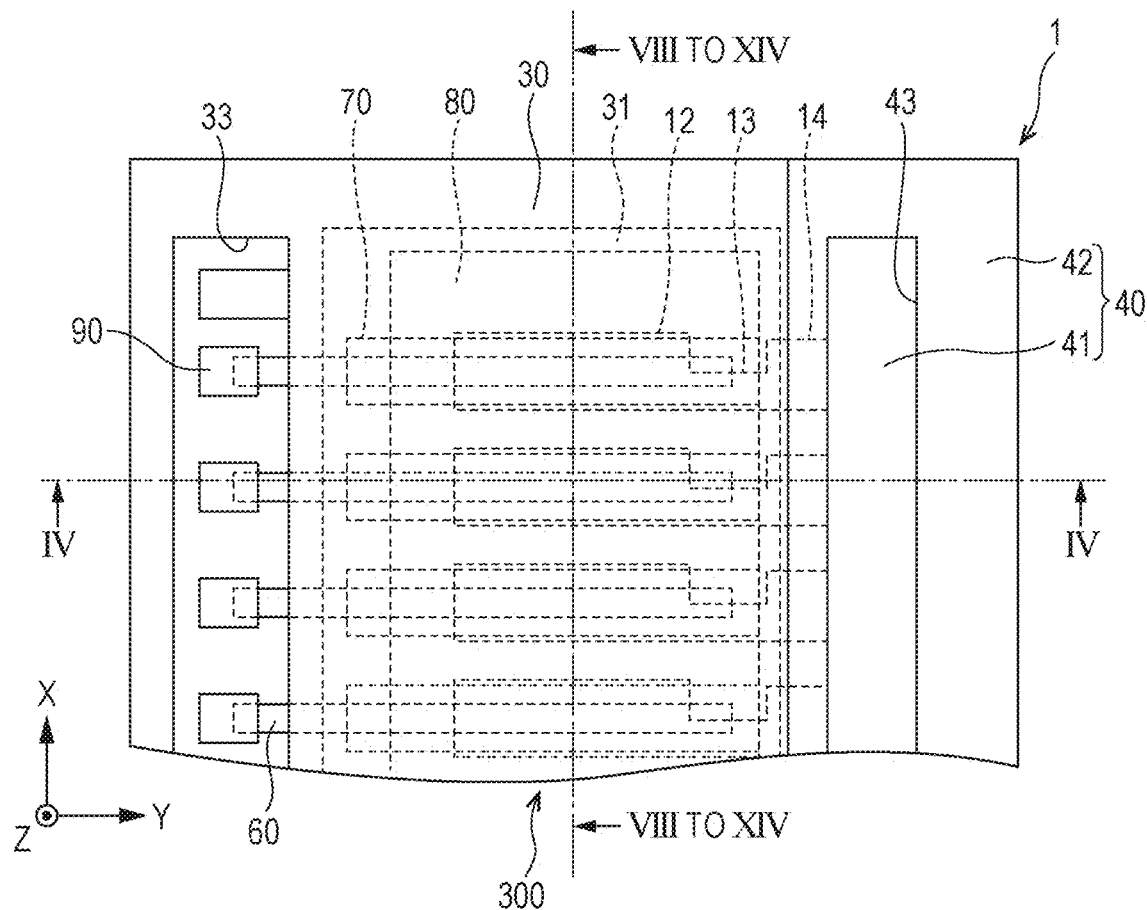
FIG. 3 is a plan view of the recording head.
Figure 4:
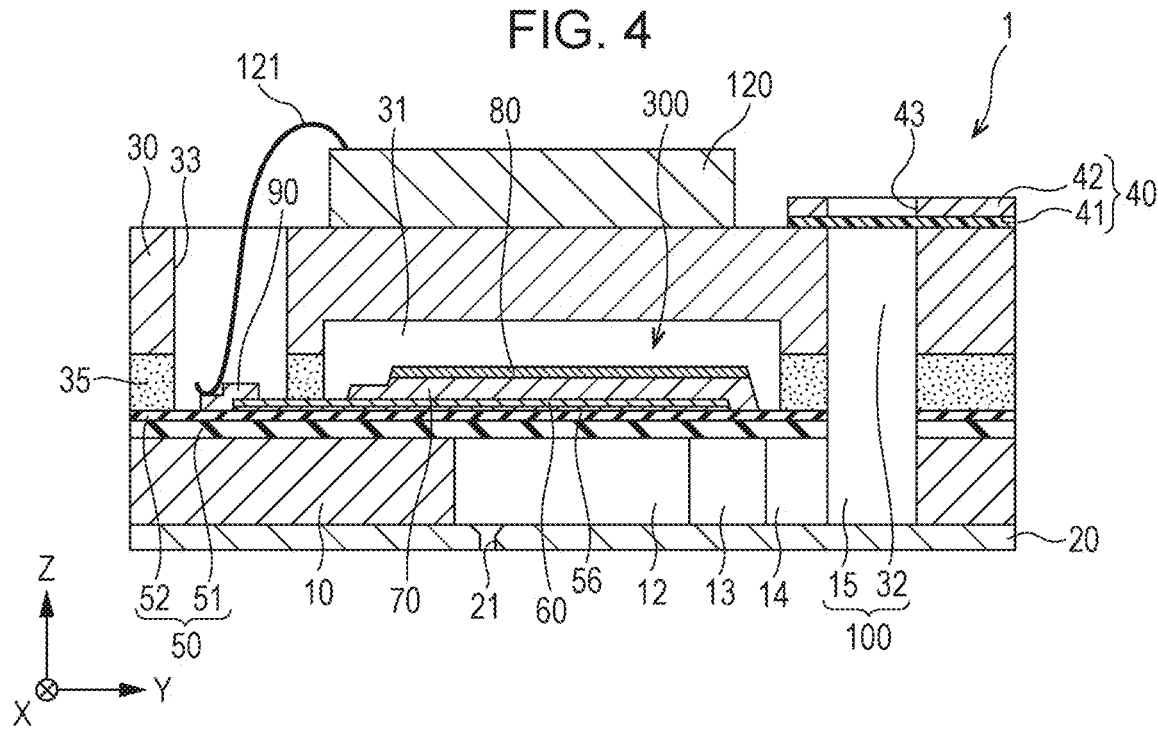
FIG. 4 is a schematic sectional view of the recording head taken along the line IV-IV of FIG. 3.

An example of a recording head 1 mounted in the ink jet recording apparatus 1000, which has been described above, is described with reference to FIGS. 2 to 4. FIG. 2 is a schematic exploded perspective view of the recording head 1, which is an example of a liquid ejecting head according to this embodiment. FIG. 3 is a plan view of the recording head 1. FIG. 4 is a schematic sectional view of the recording head 1 taken along the line IV-IV of FIG. 3. In FIGS. 2 to 4, three axes perpendicular to each other, that is, an X-axis, a Y-axis, and a Y-axis are shown.

As shown in FIGS. 2 to 4, the recording head 1 includes, for example, a channeled substrate 10, a nozzle plate 20, a protective substrate 30, a compliance substrate 40, a diaphragm 50, lead electrodes 90, a manifold 100, a driving circuit 120, a printer controller 200, and a piezoelectric element (for example, a piezoelectric element 300) according to the invention.

The channeled substrate 10 (hereinafter simply referred to as the "substrate 10") is, for example, a monocrystalline silicon substrate. The substrate 10 has pressure-generating chambers 12 formed therein. The pressure-generating chambers 12 are separated by a plurality of separators 11.

In the substrate 10, an ink supply channel 13 and a communicating channel 14 are located at one end of each pressure-generating chamber 12 in a Y-axis direction. One side of the pressure-generating chamber 12 is narrowed in an X-axis direction and therefore the ink supply channel 13 is configured to have a small aperture area. The communicating channel 14 has substantially the same width as that of the pressure-generating chamber 12 in an X-axis direction. A communicating section 15 is located outside the communicating channel 14 (in the positive Y-axis direction). The communicating section 15 makes up a portion of a manifold 100. The manifold 100 serves as an ink chamber common to the pressure-generating chambers 12. As described above, the substrate 10 has a liquid channel composed of the pressure-generating chambers 12, the ink supply channels 13, the communicating channels 14, and the communicating section 15.

The substrate 10 has a surface (a surface in the negative Z-axis direction) bonded to the nozzle plate 20. The nozzle plate 20 is made of, for example, SUS. The nozzle plate 20 has nozzle openings 21 arranged in an X-axis direction. Each of the nozzle openings 21 communicates with a corresponding one of the pressure-generating chambers 12. The nozzle plate 20 is bonded to the substrate 10 with, for example, an adhesive, a heat welding film, or the like.

The substrate 10 has another surface (a surface in the positive Z-axis direction) overlaid with the diaphragm 50. The diaphragm 50 is composed of, for example, an elastic layer 51 formed on the channeled substrate 10 and an insulating layer 52 formed on the elastic layer 51. The elastic layer 51 is, for example, a silicon dioxide ($SiO_2$) layer. The insulating layer 52 is, for example, a zirconium oxide ($ZrO_2$) layer. The elastic layer 51 need not be a member separated from the substrate 10. A portion of the substrate 10 may be thinly worked so as to serve as an elastic layer.

The insulating layer 52, which is made of zirconium oxide, is excellent in bending strength and therefore is suitable as a member of a flexurally vibrating diaphragm. The insulating layer 52 may be made of, for example, a material, such as silicon nitride (SiN), excellent in bending strength like zirconium oxide instead of zirconium oxide. Nitrides such as silicon nitride have high heat resistance, are good in preventing atomic diffusion, and therefore are useful as materials for devices which contain a piezoelectric containing an alkali metal and which are processed by high-temperature heat treatment. Similarly to silicon nitride, zirconium nitride (ZrN), which is a nitride, has the excellent power to bond $ZrO_2$ and $SiO_2$ together and therefore can impart higher mechanical durability to a diaphragm when the insulating layer 52 has a $ZrO_2$/ZrN structure (a multilayer structure composed of a ZrN layer and a $ZrO_2$ layer placed on the ZrN layer).

The piezoelectric element 300 includes first electrodes 60, piezoelectric layers 70, and a second electrode 80 and is placed above the insulating layer 52 with an adhesive layer 56 therebetween. The adhesive layer is one for increasing the adhesion between the first electrodes 60 and a base. The adhesive layer 56 is, for example, a titanium (Ti) layer, a titanium oxide ($TiO_x$) layer, a titanium carbide (TiC) layer, a titanium nitride (TiN) layer, or the like. In the case of using the adhesive layer 56, the adhesive layer 56, as well as the insulating layer 52, functions as a stopper preventing diffusion of potassium and sodium, which are elements making up the piezoelectric layers 70, from reaching the substrate 10 through the first electrodes 60 when the piezoelectric layers 70 are formed as described below.

In the recording head 1, the diaphragm 50 and the first electrodes 60 are displaced by the displacement of the piezoelectric layers 70, which have electromechanical transduction properties. That is, in the recording head 1, the diaphragm 50 and the first electrodes 60 substantially have a function as a diaphragm. The elastic layer 51 and the insulating layer 52 may be omitted such that the first electrodes 60 only function as a diaphragm. In the case where the first electrodes 60 are provided directly on the channeled substrate 10, the first electrodes 60 are preferably protected with an insulating protective film or the like such that the first electrodes 60 do not touch ink.

The first electrodes 60 are separated for each pressure-generating chamber 12. That is, the first electrodes 60 are configured as an individual electrode independent for each pressure-generating chamber 12. In an X-axis direction, the first electrodes 60 have a width less than the width of the pressure-generating chambers 12. In a Y-axis direction, the first electrodes 60 have a width greater than the width of the pressure-generating chambers 12. That is, in a Y-axis direction, both end portions of each of the first electrodes 60 are located outside a region facing a corresponding one of the pressure-generating chambers 12. In a Y-axis direction, each of the lead electrodes 90 is connected to one end portion (opposite to the communicating channels 14) of a corresponding one of the first electrodes 60.

The piezoelectric layers 70 are located between the first electrodes 60 and the second electrode 80. In an X-axis direction, the piezoelectric layers 70 have a width greater than the Y-axis length of the pressure-generating chambers 12. In a Y-axis direction, one end portion of each of the piezoelectric layers 70 that is located on the ink supply channel 13 side (an end portion in the positive Y-axis direction) is located outside an end portion of a corresponding one of the first electrodes 60. That is, the other end portion of each of the piezoelectric layers 70 (an end portion in the negative Y-axis direction) is covered by a corresponding one of the piezoelectric layers 70. One end portion of each of the piezoelectric layers 70 (an end portion in the negative Y-axis direction) is located inside one end portion of a corresponding one of the first electrodes 60 (an end portion in the negative Y-axis direction). That is, the other end portion of each of the first electrodes 60 (an end portion in the negative Y-axis direction) is not covered by a corresponding one of the piezoelectric layers 70.

The second electrode 80 extends over the piezoelectric layers 70, the first electrodes 60, and the diaphragm 50. The second electrode 80 is configured as a common electrode common to the piezoelectric layers 70. Incidentally, the first electrodes 60 rather than the second electrode 80 may be common electrodes, which are not shown.

The protective substrate 30 is fixed on the diaphragm 50, which is provided with the piezoelectric element 300, with an adhesive 35. The protective substrate 30 includes a manifold section 32. The manifold section 32 makes up at least one portion of the manifold 100. As shown in FIG. 4, the manifold section 32 extends through the protective substrate 30 in a thickness direction (a Z-axis direction) and also extends in a width direction (an X-axis direction) of the pressure-generating chambers 12. The manifold section 32 communicates with the communicating section 15 of the substrate 10. The manifold 100 is composed of these components and serves as an ink chamber common to the pressure-generating chambers 12.

The protective substrate 30 has a piezoelectric element-holding section 31 in a region containing the piezoelectric element 300. The piezoelectric element-holding section 31 has a space sufficient not to inhibit the movement of the piezoelectric element 300. This space may be hermetically sealed or need not be hermetically sealed. In the case where alkali metal atoms contained in the piezoelectric element 300 may possibly diffuse out of the piezoelectric element 300 to impair device functions, an anti-diffusion film (not shown) may be provided on a surface of the protective substrate 30 or the second electrode 80 when the protective substrate 30 forms an enclosed space. When the protective substrate 30 forms no enclosed space, an anti-diffusion film (not shown) may be provided on a surface of the second electrode 80. A $ZrO_2$ film, $SiO_2$ film, and nitride film (for example, a silicon nitride (SiN) film) capable of suppressing the diffusion of the alkali metal atoms are suitable as an anti-diffusion film. Furthermore, it is effective that a conductive nitride film, that is, a zirconium nitride (ZrN) or a titanium nitride (TiN) film is formed on a surface of the second electrode 80. The protective substrate 30 has a through-hole 33 extending through the protective substrate 30 in a thickness direction (a Z-axis direction). End portions of the lead electrodes 90 are exposed in the through-hole 33.

A driving circuit 120 functioning as a signal-processing section is fixed on the protective substrate 30. The driving circuit 120 used may be, for example, a circuit board or a semiconductor integrated circuit (IC). The driving circuit 120 and the lead electrodes 90 are electrically connected to each other through connecting lines 121. The driving circuit 120 can be electrically connected to the printer controller 200. In this embodiment, the driving circuit 120 functions as a control unit.

The compliance substrate 40 is composed of a sealing layer 41 and a fixing plate 42 and is fixed on the protective substrate 30. A region of the fixing plate 42 that faces the manifold 100 is completely removed in a Z-axis direction that is a thickness direction and is an opening portion 43. A surface of the manifold 100 (a surface in the positive Z-axis direction) is sealed only with the sealing layer 41, which is flexible.

1.2. Piezoelectric Element

Details of the piezoelectric element 300 are described below. The piezoelectric element 300 includes the first electrodes 60; the piezoelectric layers 70, which are placed on or above the first electrodes 60 (on the first electrodes 60 in FIG. 4); and the second electrode 80, which is placed on or above the piezoelectric layers 70 (on the piezoelectric layers 70 in FIG. 4). The first electrodes 60 have a thickness of, for example, about 50 nm. The piezoelectric layers 70 have a thickness of, for example, 50 nm to 2,000 nm. The piezoelectric layers 70 are layers composed of so-called piezoelectric thin films. The second electrode 80 has a thickness of, for example, about 50 nm.

The first electrodes 60 and the second electrode 80 are made of, for example, a noble metal such as platinum (Pt) or iridium (Ir). The first electrodes 60 and the second electrode 80 may be made of the same material or different materials.

The piezoelectric layers 70 are placed between the first electrodes 60 and the second electrode 80. The piezoelectric layers 70 are formed by, for example, a solution process. The piezoelectric layers 70 contain potassium (K), sodium (Na), niobium (Nb), titanium (Ti), and oxygen (O). The piezoelectric layers 70 are made of, for example, a piezoelectric material composed of a KNN composite oxide. The piezoelectric layers 70 are, for example, potassium sodium niobate (KNN) layers doped with titanium. The KNN layers are made of a composite oxide, represented by the formula $ABO_3$, having a perovskite structure. The composition of the KNN layers (the composition of potassium, sodium, niobium, and oxygen in the piezoelectric layers 70) satisfies the following formula:

$$(K_x, Na_{1-x})NbO_3 \quad (1)$$

where $0.1 \leq x \leq 0.9$.

The KNN composite oxide is a piezoelectric material without lead (Pb) content and therefore has excellent biocompatibility and little impact on the environment. Among lead-free piezoelectric materials, the KNN composite oxide has excellent piezoelectric characteristics and therefore is advantageous in enhancing various characteristics. In addition, the KNN composite oxide has a relatively higher Curie temperature as compared to other lead-free piezoelectric materials (for example, BNT-BKT-BT; [(Bi, Na)$TiO_3$]—[(Bi, K)$TiO_3$]—[$BiTiO_3$]), is unlikely to be depolarized by an increase in temperature, and therefore can be used at high temperature.

In Formula (1), the content of K is preferably 30% by mole to 70% by mole with respect to the total amount of a metal element making up an A-site (in other words, the content of Na is preferably 30% by mole to 70% by mole with respect to the total amount of the metal element making up the A-site). That is, in Formula (1), it is preferable that $0.3 \leq x \leq 0.7$. This allows the composite oxide to have a composition advantageous for piezoelectric characteristics. The content of K is more preferably 35% by mole to 55% by mole with respect to the total amount of the metal element making up the A-site (in other words, the content of Na is more preferably 35% by mole to 55% by mole with respect to the total amount of the metal element making up the A-site). That is, in Formula (1), it is more preferable that $0.35 \leq x \leq 0.55$. This allows the composite oxide to have a composition more advantageous for piezoelectric characteristics.

In the piezoelectric layers 70, Ti is contained in the KNN layers in the form of an additive. Ti is contained in, for example, a B-site of each KNN layer. The content of Ti is preferably 20% by mole or less and 3% by mole or more with respect to the number of moles of Nb, more preferably 15% by mole or less, and 10% by mole or less. When the content of Ti is 20% by mole or less with respect to the number of moles of Nb, the piezoelectric layers 70 can sufficiently exhibit characteristics derived from KNN.

The unevenness of Ti in the piezoelectric layers 70 is indicated by a U-value. The U-value is, for example, 140% or less and is preferably 130% or less. The U-value is represented by the following formula:

$$U = \{2 \times (I_{MAX} - I_{MIN})/(I_{MAX} + I_{MIN})\} \times 100 \quad (2).$$

In Formula (2), $I_{MAX}$ is the maximum intensity of a signal from Ti in a predetermined zone of each piezoelectric layer 70 as analyzed from the second electrode 80 side in a depth direction by secondary ion mass spectroscopy (SIMS) and $I_{MIN}$ is the minimum intensity of the signal from Ti in the predetermined zone of the piezoelectric layer 70 as analyzed from the second electrode 80 side in the depth direction by SIMS.

In SIMS, atoms making up a piezoelectric element are emitted in a vacuum by applying ions to a surface of the piezoelectric element, whereby secondary ions are generated. The secondary ions are mass-separated and are detected, whereby an element present in the piezoelectric element in the depth direction (thickness direction) and the concentration thereof can be known.

In the invention, in SIMS, a zone of the piezoelectric layers 70 is defined using Nb. This is because Nb is the last element that diffuses and is also an element that is highest in concentration uniformity in the depth direction among major elements, such as K, Na, and Nb, making up the piezoelectric layers 70.

In the invention, in SIMS, the maximum intensity of a signal from Ti in a predetermined zone α of a piezoelectric layer is defined as $I_{MAX}$ and the minimum intensity of the signal from Ti in the predetermined zone α of the piezoelectric layer is defined as $I_{MIN}$.

Figure 5:
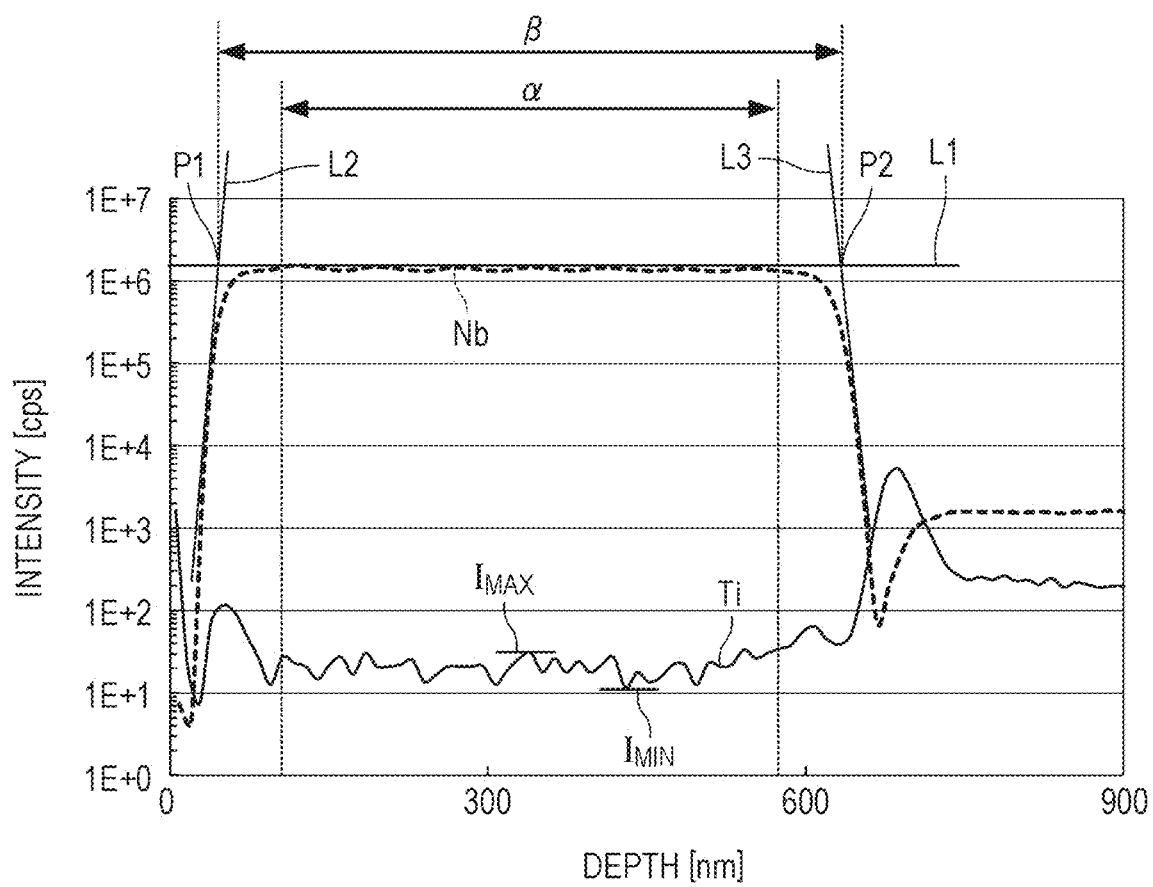
FIG. 5 is a graph showing results obtained by measuring Nb and Ti in a piezoelectric element by SIMS.
Figure 6:
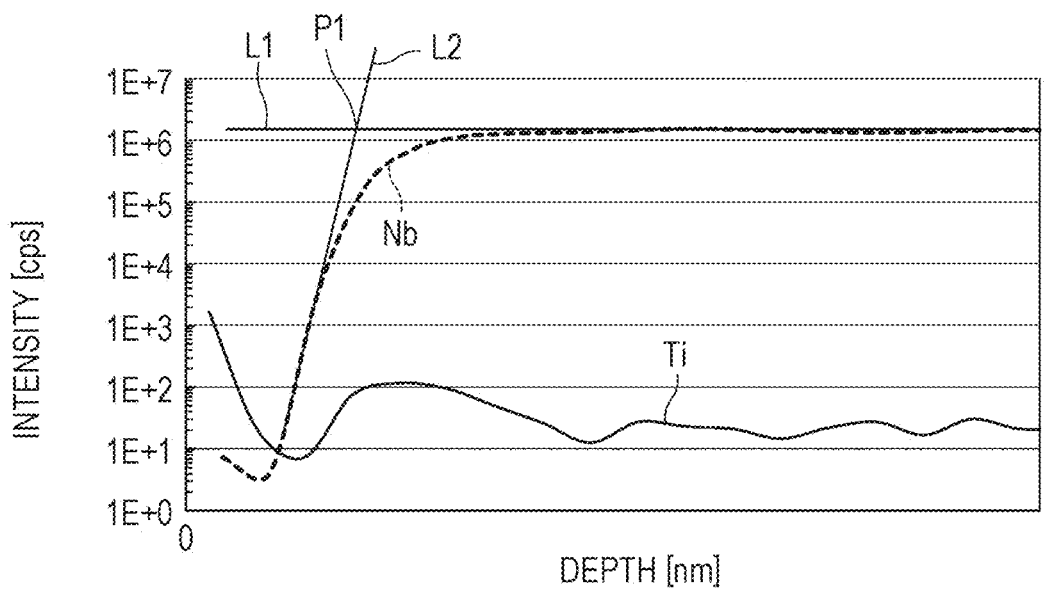
FIG. 6 is a graph showing results obtained by measuring Nb and Ti in the piezoelectric element by SIMS.
Figure 7:
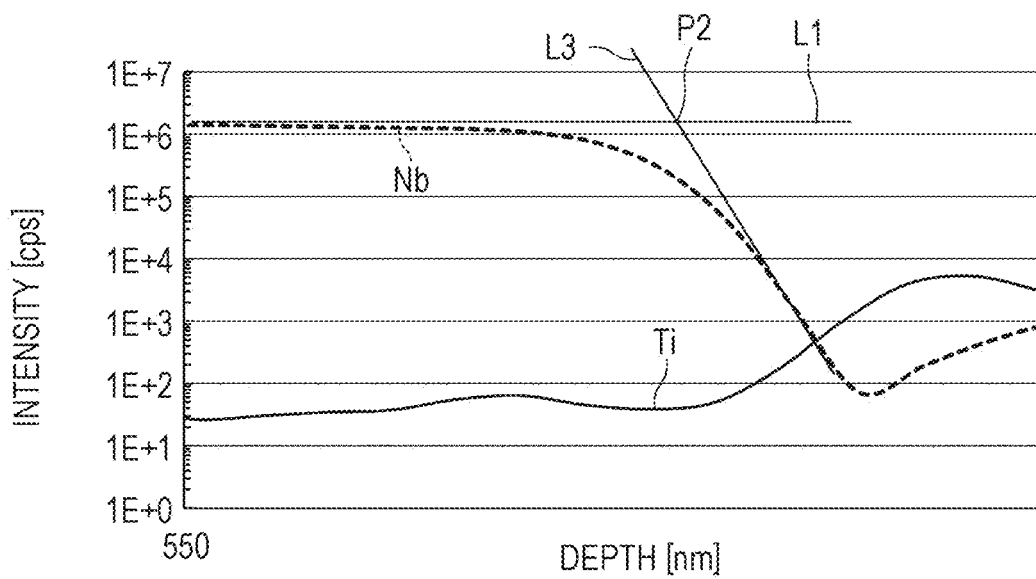
FIG. 7 is a graph showing results obtained by measuring Nb and Ti in the piezoelectric element by SIMS.

In SIMS, the predetermined zone α of the piezoelectric layer is described below in detail. FIGS. 5 to 7 are graphs showing results obtained by measuring Nb and Ti in a piezoelectric element by SIMS and are illustrations showing the predetermined zone α. In FIGS. 5 to 7, the horizontal axis represents the depth of the piezoelectric element from the second electrode side. That is, "0" on the horizontal axis indicates the position of the upper surface of the piezoelectric element (the upper surface of the second electrode). FIG. 6 is an enlarged view of the vicinity of 0 nm in the depth direction of FIG. 5. FIG. 7 is an enlarged view of the vicinity of 600 nm in the depth direction of FIG. 5. The vertical axis represents the intensity of a signal from each atom and the signal intensity correlates with the concentration of an element. FIGS. 5 to 7 are those obtained by measurement using a secondary ion mass spectrometer, "IMS 7F", available from CAMECA.

In SIMS, a region β (a zone of the piezoelectric layer) occupied by the piezoelectric layer is as defined below. Referring to FIGS. 5 to 7, L1 is a straight line which passes through the maximum intensity of a signal from Nb and which is parallel to the horizontal axis and L2 and L3 are tangents to a curve showing a signal from Ti (a curve in the case of expressing the signal intensity in a logarithmic form) at points having an intensity one-thousandth that of the straight line L1. The tangent L2 is a tangent to a curve showing the rise of the intensity of Nb in an upper portion of the piezoelectric layer. The intersection P1 of the straight line L1 and the tangent L2 is defined as the position of a surface of the piezoelectric layer (that is, the interface between the piezoelectric layer and the second electrode). The tangent L3 is a tangent to a curve showing the rise of the intensity of Nb in a lower portion of the piezoelectric layer. The intersection P2 of the straight line L1 and the tangent L3 is defined as the position of the lowermost portion of the piezoelectric layer (that is, the interface between the piezoelectric layer and a first electrode).

As shown in FIG. 5, in the zone β of the piezoelectric layer, a portion excluding the depth from intersection P1 to 10% of the zone β and the depth from intersection P2 to 10% of the zone β is defined as the predetermined zone α. This is because in the vicinity of the boundary (interface) between different materials, the detection accuracy of atoms is impaired and any signal cannot be accurately detected. In the invention, the maximum intensity of the signal from Ti in the predetermined zone α is $I_{MAX}$ and the minimum intensity of the signal from Ti in the predetermined zone α is $I_{MIN}$ as described above.

The piezoelectric layers 70 may contain lithium (Li). The piezoelectric layers 70 may be KNN layers doped with Li in addition to Ti. Most of Li is located in an A-site to form $LiNbO_3$ and a portion thereof segregates at grain boundaries. This case suppresses the grain boundary diffusion of K and Na to contribute to the enhancement of electrical characteristics. The content of Li is preferably, for example, 20% by mole or less with respect to the sum of the number of moles of K and that of Na; more preferably 15% by mole or less; and further more preferably 10% by mole or less when the content of Li is 20% by mole or less with respect to the sum of the number of moles of K and that of Na, the piezoelectric layers 70 can sufficiently exhibit the characteristics derived from KNN.

An alkali metal in the A-site may be added excessively to the stoichiometric composition of the perovskite structure. Alternatively, the alkali metal in the A-site may be deficient to the stoichiometric composition of the perovskite structure. Thus, the composition of the composite oxide according to this embodiment can satisfy the following formula:

$$(K_x Na_{(1-x)})_A NBO_3 \quad (3)$$

where $0.1 \leq x \leq 0.9$ and $0.85 \leq A \leq 1.15$.

In Formula (3), A represents the amounts of K and Na that may be excessively added or that may be deficient. When the amounts of K and Na are excessive, A is greater than 1.0. When the amounts of K and Na are deficient, A is less than 1.0. For example, the fact that A is equal to 1.1 shows that, supposing that the amounts of K and Na in the stoichiometric composition are 100% by mole, 110% by mole of K and Na are contained. The fact that A is equal to 0.9 shows that, supposing that the amounts of K and Na in the stoichiometric composition are 100% by mole, 90% by mole of K and Na are contained. When the alkali metal in the A-site is not excessive or deficient to the stoichiometric composition, A is equal to 1.

From the viewpoint of enhancing characteristics, in Formula (3), it is preferable that $0.90 \leq A \leq 1.10$ and it is more preferable that $0.95 \leq A \leq 1.05$. It is preferable that $0.3 \leq x \leq 0.7$ and it is more preferable that $0.35 \leq x \leq 0.55$.

Piezoelectric materials include materials having a composition lacking a portion of an element, materials having a composition in which a portion of an element is excessive, and materials having a composition in which an element is partially substituted with another element. A piezoelectric material according to this embodiment includes materials shifting from the stoichiometric composition because of lack or excess and materials in which an element is partially substituted with another element unless fundamental characteristics of the piezoelectric layers 70 vary.

The piezoelectric layers 70 may contain a piezoelectric material expressed as a mixed crystal containing a composite oxide (KNN composite oxide), containing K, Na, and Nb, having an $ABO_3$ perovskite structure and another composite oxide having the $ABO_3$ perovskite structure. The other composite oxide is preferably a lead-free piezoelectric material containing no lead (Pb). The other composite oxide is more preferably a lead-free piezoelectric material containing no lead (Pb) or bismuth (Bi). These allow the piezoelectric element 300 to have excellent biocompatibility and little impact on the environment.

The piezoelectric layers 70 are predominantly oriented in, for example, a predetermined crystal plane. For example, the KNN composite oxide is likely to be naturally oriented in the (100) plane and therefore the piezoelectric layers 70 are also likely to be naturally oriented in the (100) plane. In addition, the piezoelectric layers 70 are oriented in the (110) or (111)

plane in some cases depending on a predetermined orientation control layer (seed layer to control crystalline orientation) placed as required. The piezoelectric layers 70 predominantly oriented in the predetermined crystal plane are likely to be enhanced in various characteristics as compared to piezoelectric layers oriented at random. The term "predominantly oriented" as used herein means that 50% or more, preferably 80% or more of crystals are oriented in a predetermined crystal plane. For example, the term "predominantly oriented in the (100) plane" includes the case where all of the piezoelectric layers 70 are oriented in the (100) plane and the case where half or more (50% or more, preferably 80% or more) of the piezoelectric layers 70 are oriented in the (100) plane.

The piezoelectric layers 70 are polycrystalline and therefore the in-plane stress is dispersed and is uniform; hence, the stress destruction of the piezoelectric element 300 is unlikely to occur and the reliability thereof is high.

The piezoelectric layers 70 have a turning point (phase transition point) in a temperature range lower than the Curie temperature in the case of checking the change in relative dielectric constant with temperature. Since the Curie temperature of KNN is about 420° C., the turning point is present at 420° C. or lower. In the case of linearly approximating the change in relative dielectric constant with temperature before the turning point and the change in relative dielectric constant with temperature after the turning point, the slope of a straight line before the turning point is larger. That is, the piezoelectric layers have a higher relative dielectric constant in a lower temperature range and therefore can be expected to have enhanced piezoelectric characteristics. The turning point can be checked in such a manner that the relationship between the relative dielectric constant and the temperature is measured using, for example, an impedance analyzer by heating with a hotplate. The turning point is preferably present at 250° C. or lower. This is because the further enhancement of piezoelectric characteristics can be expected when the turning point is present at a temperature close to room temperature. The term "turning point" refers to a point at which in the case of graphing the relationship between the relative dielectric constant and temperature, supposing that the relationship therebetween changes linearly, the slope thereof changes.

When an electric field with an intensity of 200 kV/cm is applied to the piezoelectric layers 70, the leakage current density is preferably, for example, $1 \times 10^{-6}$ A/cm$^2$ or less and more preferably $8 \times 10^{-6}$ A/cm$^2$ or less. Having such a leakage current density allows the piezoelectric element 300 to have a small amount of heat generated by the leakage current, that is, small changes in piezoelectric characteristics due to heat or a small reduction in charge due to the leakage current, that is, small reductions in piezoelectric characteristics. For the leakage current density, an electric field is applied between the first electrodes 60 and the second electrode 80 and a so-called escape current is measured as a leakage current 5 seconds or more after the application of the electric field. The leakage current density can be measured using, for example, "4140B pA Meter" available from Agilent Technologies.

The piezoelectric element 300 has, for example, features below.

In the piezoelectric element 300, the piezoelectric layers 70 contain potassium, sodium, niobium, titanium, and oxygen. Therefore, the piezoelectric element 300 has a smaller leakage current as compared to the case where a piezoelectric layer does not contain titanium but contains potassium, sodium, niobium, and oxygen (for details, refer to "3. Experiment examples" below).

In the piezoelectric element 300, the leakage current density is $1 \times 10^{-6}$ A/cm$^2$ or less when an electric field with an intensity of 200 kV/cm is applied to the piezoelectric layers 70. When the leakage current density is $1 \times 10^{-6}$ A/cm$^2$ or less, the reduction in effective potential (effective applied voltage) due to the leakage current can be reliably lowered. Furthermore, heat generation due to the leakage current and destruction due to heat generation can be reliably suppressed.

In the piezoelectric element 300, the U-value, which indicates the unevenness of Ti in the piezoelectric layers 70, is 140% or less. This allows the leakage current density of the piezoelectric element 300 to be $1 \times 10^{-6}$ A/cm$^2$ or less (for details, refer to "3. Experiment examples" below).

In the piezoelectric element 300, the composition of potassium, sodium, niobium, titanium, and oxygen in the piezoelectric layers 70 satisfies Formula (3). In the piezoelectric element 300, when the range of A satisfies the inequality $0.85 \leq A \leq 1.15$, the piezoelectric element 300 is capable of having good characteristics even if potassium or sodium deviates from the stoichiometric composition of the perovskite structure.

In the piezoelectric element 300, the piezoelectric layers 70 contain lithium and the content of lithium is 20% by mole or less with respect to the sum of the number of moles of potassium and that of sodium. Therefore, the piezoelectric element 300 has, for example, a smaller leakage current as compared to the case where a piezoelectric layer contains no lithium. Furthermore, the piezoelectric element 300 can sufficiently exhibit characteristics derived from KNN as compared to the case where the content of lithium is more than 20% by mole with respect to the sum of the number of moles of potassium and that of sodium.

2. METHOD FOR MANUFACTURING PIEZOELECTRIC ELEMENT

Figure 8:
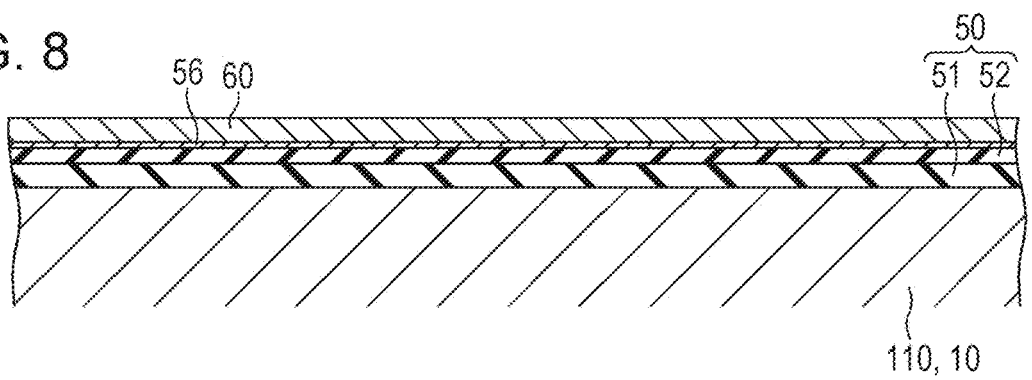
FIG. 8 is a sectional view taken along the line VIII-VIII of FIG. 3.
Figure 9:
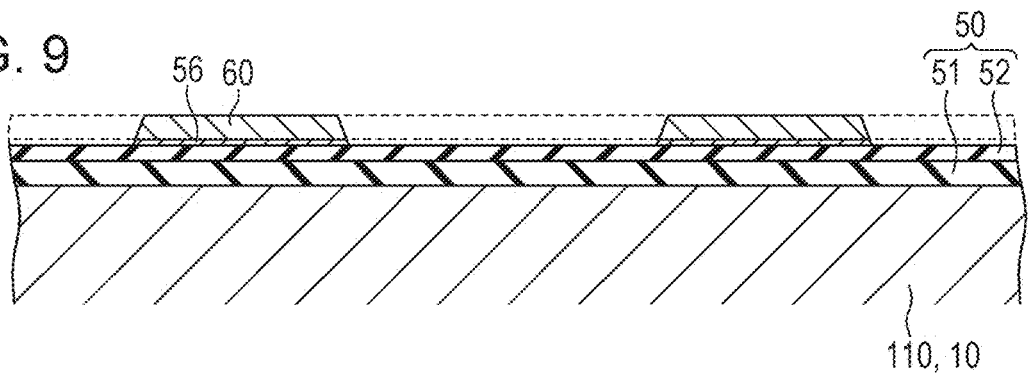
FIG. 9 is a sectional view taken along the line IX-IX of FIG. 3.
Figure 10:
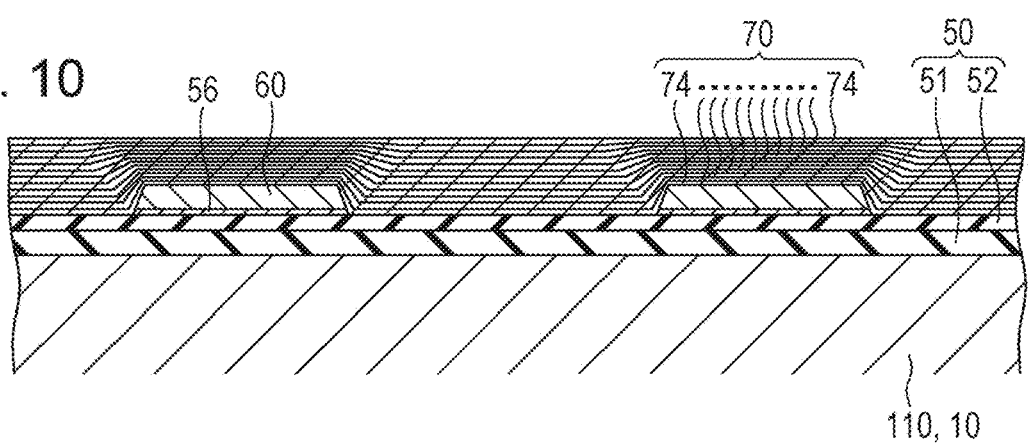
FIG. 10 is a sectional view taken along the line X-X of FIG. 3.
Figure 11:
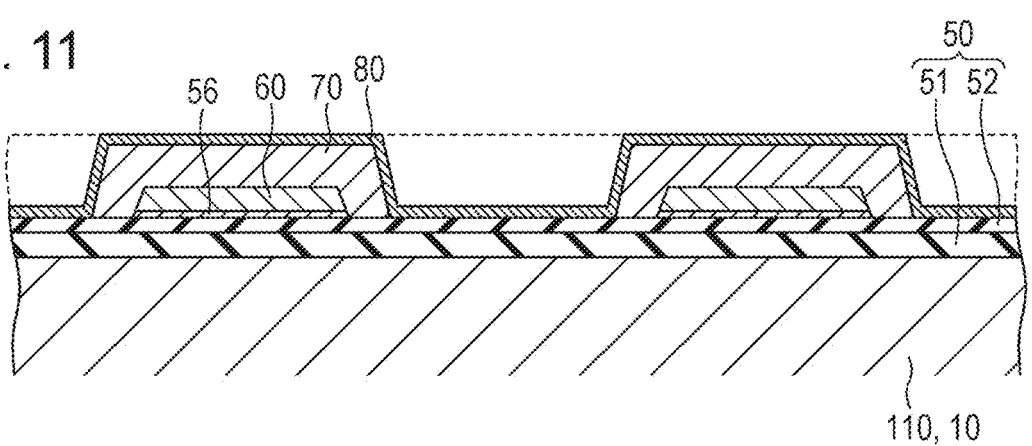
FIG. 11 is a sectional view taken along the line XI-XI of FIG. 3.
Figure 12:
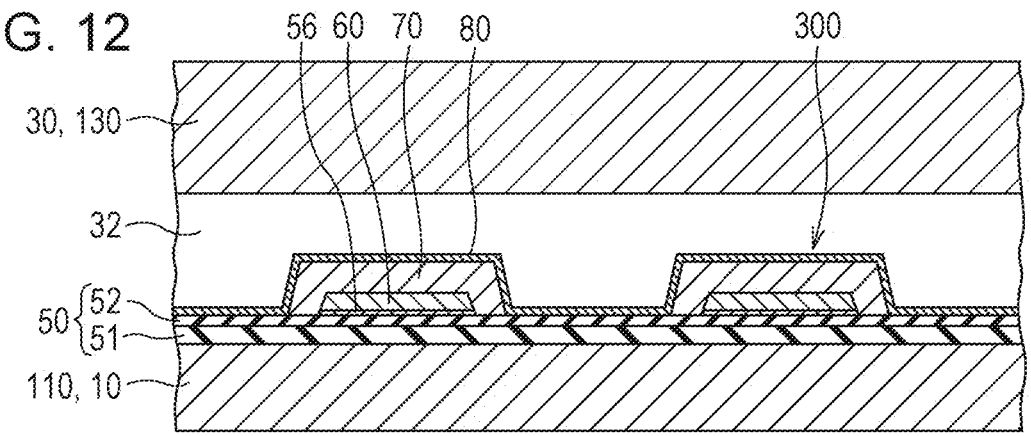
FIG. 12 is a sectional view taken along the line XII-XII of FIG. 3.
Figure 13:
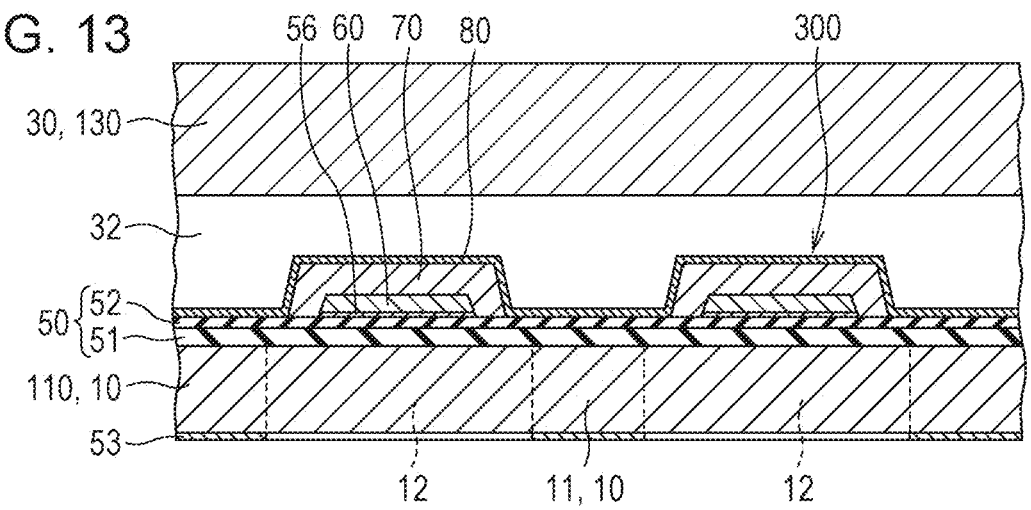
FIG. 13 is a sectional view taken along the line XIII-XIII of FIG. 3.
Figure 14:
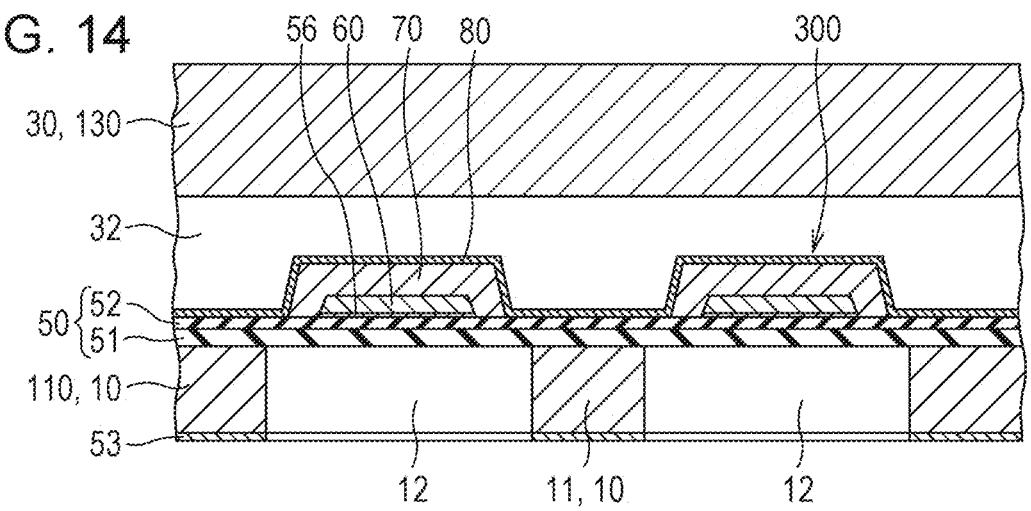
FIG. 14 is a sectional view taken along the line XIV-XIV of FIG. 3.

A method for manufacturing the piezoelectric element 300 is described below together with a method for manufacturing the recording head 1 with reference to FIGS. 8 to 14. FIGS. 8 to 14 schematically show steps of manufacturing the recording head 1. FIG. 8 is a sectional view taken along the line VIII-VIII of FIG. 3. FIG. 9 is a sectional view taken along the line IX-IX of FIG. 3. FIG. 10 is a sectional view taken along the line X-X of FIG. 3. FIG. 11 is a sectional view taken along the line XI-XI of FIG. 3. FIG. 12 is a sectional view taken along the line XII-XII of FIG. 3. FIG. 13 is a sectional view taken along the line XIII-XIII of FIG. 3. FIG. 14 is a sectional view taken along the line XIV-XIV of FIG. 3.

As shown in FIG. 8, a silicon substrate (hereinafter also referred to as the wafer) 110 is prepared. Next, the silicon substrate 110 is thermally oxidized, whereby the elastic layer 51, which is made of silicon dioxide, is formed on a surface of the silicon substrate 110. Furthermore, a zirconium layer is formed on the elastic layer 51 by a sputtering process and is then thermally oxidized, whereby the insulating layer 52 is formed. In this way, the diaphragm 50, which is composed of the elastic layer 51 and the insulating layer 52, is obtained.

Next, the adhesive layer 56, which contains titanium, is formed on the insulating layer 52 by, for example, a sputtering process or the like.

Next, the first electrodes 60 are formed on the adhesive layer 56 by, for example, a sputtering process, a vapor deposition process, or the like.

Next, the wafer 110 provided with the diaphragm 50, the adhesive layer 56, and the first electrodes 60 is heat-treated in a nitrogen atmosphere using a rapid thermal annealing (RTA) system that is an infrared lamp system. The attained temperature of heat treatment is preferably, for example, 500° C. to 800° C. and more preferably 650° C. to 750° C. The heat treatment time is, for example, 1 minute to 5 minutes. Titanium in the adhesive layer 56 (titanium making up the adhesive layer 56) can be evenly diffused into the first electrodes 60 by the heat treatment. This enables the even diffusion of titanium in the piezoelectric layers to be promoted in a step of forming the piezoelectric layers 70. Heat-treating the wafer 110 in the nitrogen atmosphere lowers the oxidation of titanium into titanium oxide, thereby enabling the polymerization of titanium oxide to be suppressed. This enables the diffusion of titanium to be facilitated.

In consideration of the adhesion between the first electrodes 60 and the diaphragm 50, a portion of titanium in the adhesive layer 56 preferably remains in the adhesive layer 56 after the heat treatment.

When the first electrodes 60 are made of platinum, the oxidation of the first electrodes 60 by the heat treatment and the change in crystal structure of the first electrodes 60 can be suppressed.

Next, as shown in FIG. 9, a mask with a predetermined shape is formed over the first electrodes 60 using a resist (not shown) and the adhesive layer 56 and the first electrodes 60 are patterned together.

Next, as shown in FIG. 10, a plurality of piezoelectric films 74 are formed so as to overlap the first electrodes 60, the adhesive layer 56, and the diaphragm 50. Each piezoelectric layer 70 is composed of the piezoelectric films 74. The piezoelectric layers 70 are formed by, for example, a solution process (chemical solution process) such as a metal-organic decomposition (MOD) process or a sol-gel process. Forming the piezoelectric layers 70 by the solution process enables the production efficiency of the piezoelectric layers 70 to be increased. The piezoelectric layers 70, which are formed by the solution process, are formed by repeating a series of steps from a step of applying a precursor solution (an application step) to a step of firing a precursor film (a firing step) multiple times.

A detailed procedure for forming the piezoelectric layers 70 by the solution process is, for example, as described below. First, a precursor solution containing a predetermined metal complex is prepared. The precursor solution is one obtained by dissolving or dispersing a metal complex capable of forming a composite oxide containing potassium, sodium, and niobium by firing in an organic solvent. In this operation, a metal complex containing an additive such as Li may be further mixed.

Examples of a metal complex containing potassium include potassium 2-ethylhexanoate and potassium acetate. Examples of a metal complex containing sodium include sodium 2-ethylhexanoate and sodium acetate. Examples of a metal complex containing niobium include niobium 2-ethylhexanoate and pentaethoxy niobium. Two or more types of metal complexes may be used in combination. For example, a combination of potassium 2-ethylhexanoate and potassium acetate may be used as a metal complex containing potassium.

Examples of the organic solvent include 2-n-butoxyethanol, n-octane, and a solvent mixture thereof. The precursor solution may contain an additive for stabilizing the dispersion of the metal complex containing potassium, sodium, and niobium. An example of such an additive is 2-ethylhexanoic acid.

The precursor solution is applied to the wafer 110 provided with the diaphragm 50, the adhesive layer 56, and the first electrodes 60, whereby the precursor film is formed (the application step). Next, the precursor film is heat-treated at a predetermined temperature of, for example, 130° C. to 250° C. for a certain time, whereby the precursor film is dried (a drying step). Next, the dried precursor film is heat-treated at a predetermined temperature of, for example, 300° C. to 450° C. and is held at this temperature for a certain time, whereby the precursor film is pyrolysed (a pyrolysing step). Next, the pyrolysed precursor film is heat-treated at a higher temperature of, for example, 650° C. to 800° C. and is held at this temperature for a certain time so as to be crystallized, whereby the piezoelectric films 74 are completed (the firing step).

Examples of a heating unit used in the drying step, the pyrolysing step, and the firing step include an RTA system performing heating by irradiation with an infrared lamp and a hotplate. The piezoelectric layers 70, which are each composed of the piezoelectric films 74, are formed by repeating the above steps multiple times. In a series of steps from the application step to the firing step, after steps from the application step to the pyrolysing step are repeated multiple times, the firing step may be performed. The heating rate of RTA is preferably set to 30° C./s to 350° C./s. The term "heating rate" refers to the rate of change in temperature with time in a temperature range from 350° C. to a target firing temperature.

In the firing step, titanium diffused in the first electrodes 60 can be evenly diffused into the piezoelectric layers 70. This allows the piezoelectric layers 70 to contain titanium.

Before or after the second electrode 80 is formed on the piezoelectric layers 70, reheating (post-annealing) may be performed in a temperature range from 600° C. to 800° C. as required. Performing post-annealing in this way allows the interface between the piezoelectric layers 70 and the first electrodes 60 and the interface between the piezoelectric layers 70 and the second electrode 80 to be good (highly flat surfaces). Furthermore, the crystallinity of the piezoelectric layers 70 can be improved. The adhesion between the first electrodes 60 and the piezoelectric layers 70 and the adhesion between the second electrode 80 and the piezoelectric layers 70 can be increased.

In this embodiment, the piezoelectric material contains alkali metals (potassium and sodium). The alkali metals are likely to be diffused into the first electrodes and the adhesive layer 56 in the firing step. If the alkali metals pass through the first electrodes 60 and the adhesive layer 56 to reach the wafer 110, the alkali metals react with the wafer 110. However, in this embodiment, the insulating layer 52, which is made of zirconium oxide, functions as a stopper against diffusion of potassium and sodium. Thus, the alkali metals can be inhibited from reaching the wafer 110, which is the silicon substrate.

Next, as shown in FIG. 11, the piezoelectric layers 70, which are each composed of the piezoelectric films 74, are patterned so as to have a predetermined shape. Patterning is performed by dry etching such as reactive ion etching or ion milling or wet etching using an etching solution.

Next, the second electrode 80 is formed over the piezoelectric layers 70. The second electrode 80 can be formed by a process similar to that used to form the first electrodes 60.

Through the above steps, the piezoelectric element 300, which includes the first electrodes 60, the piezoelectric layers 70, and the second electrode 80, can be formed.

Next, as shown in FIG. 12, a protective substrate wafer 130 is bonded to a surface of the wafer 110 that is located on the piezoelectric element 300 side with the adhesive 35 (refer to FIG. 4). Next, the protective substrate wafer 130 is thinned by grinding a surface of the protective substrate wafer 130. Next, the manifold section 32 and the through-hole 33 (refer to FIG. 4) are formed in the protective substrate wafer 130.

Next, as shown in FIG. 13, a mask layer 53 is formed on a surface of the wafer 110 that is located opposite to the piezoelectric element 300. The mask layer 53 is patterned so as to have a predetermined shape.

Next, as shown in FIG. 14, the wafer 110 is anisotropically etched (wet-etched) through the mask layer 53 using an alkali solution such as a KOH solution. This allows the pressure-generating chambers 12, which correspond to the piezoelectric element 300, the ink supply channels 13, the communicating channels 14, and the communicating section 15 (refer to FIG. 4) to be formed.

Next, an unnecessary portion of an outside edge section of each of the wafer 110 and the protective substrate wafer 130 is cut and removed by dicing or the like. Next, the nozzle plate 20 (refer to FIG. 4) is bonded to the surface of the wafer 110 that is located opposite to the piezoelectric element 300. Next, the compliance substrate (refer to FIG. 4) is bonded to the protective substrate wafer 130.

Through the above steps, a cluster of chips for the recording head 1 can be manufactured. The recording head 1 can be manufactured by dividing the cluster into individual chips.

The method for manufacturing the piezoelectric element 300 has, for example, features below.

The method for manufacturing the piezoelectric element 300 includes a step of forming the adhesive layer 56, which contains titanium, before a step of forming the first electrodes 60 and also includes a step of diffusing titanium, contained in the adhesive layer 56, into the first electrodes 60 by heat-treating the adhesive layer 56 at a temperature of 650° C. to 750° C. after the step of forming the first electrodes 60. A step of forming the piezoelectric layers 70 includes a sub-step of diffusing titanium, diffused in the first electrodes 60, into the piezoelectric layers 70 by heat treatment. Therefore, in the method for manufacturing the piezoelectric element 300, titanium can be evenly diffused into the piezoelectric layers 70 (for details, refer to "3. Experiment examples" below).

Since titanium in the adhesive layer 56 is diffused into the first electrodes 60 and the piezoelectric layers 70, the adhesion between the first electrodes 60 and the insulating layer 52 is concerned. However, the adhesive layer 56, which contains titanium that forms chemical bonds between the first electrodes 60 and the insulating layer 52, can sufficiently bond the first electrodes 60 and the insulating layer 52 together when the adhesive layer 56 is a one-atom thick monolayer (monoatomic layer) of titanium. Thus, even though titanium in the adhesive layer 56 is diffused, the adhesion between the first electrodes 60 and the insulating layer 52 can be ensured.

The following example has been described above: an example in which titanium in the adhesive layer 56 is diffused into the first electrodes 60 in such a manner that after the first electrodes 60 are formed, the adhesive layer is heat-treated in the nitrogen atmosphere and furthermore, the piezoelectric layers 70 are formed so as to contain titanium in such a manner that titanium diffused in the first electrodes 60 is diffused into the piezoelectric layers 70 (piezoelectric films 74) in the firing step. However, in the method for manufacturing the piezoelectric element 300, the piezoelectric layers 70 may be formed so as to contain titanium using a precursor solution obtained by dissolving or dispersing a metal complex capable of forming a composite oxide containing potassium, sodium, and niobium by firing in an organic solvent. In this case, no heat treatment needs to be performed in the nitrogen atmosphere after the first electrodes 60 are formed. An example of a metal complex containing titanium is titanium isopropoxide.

The piezoelectric layers 70 may be formed by a sputtering process. In this case, a sputter target may contain titanium.

The piezoelectric layers 70 may contain lithium. In this case, the precursor solution may contain a metal complex containing lithium. An example of the metal complex containing lithium is lithium 2-ethylhexanoate.

3. EXPERIMENT EXAMPLES

The invention is further described below in detail with reference to experiment examples. The invention is not in any way limited to the experiment examples.

3.1. Preparation of Samples

Piezoelectric elements were prepared in Examples 1 to 5 by a method below.

3.1.1. Example 1

A surface of a silicon substrate was thermally oxidized, whereby an elastic layer (a thickness of 1,000 nm) made of silicon dioxide was formed on the silicon substrate. Next, a zirconium layer was formed on the elastic layer by a sputtering process. The zirconium layer was thermally oxidized, whereby an insulating layer (a thickness of 400 nm) made of zirconium oxide was formed. Next, titanium was deposited on the insulating layer to a thickness of 20 nm by a sputtering process, whereby an adhesive layer was formed. After a platinum layer was formed on the adhesive layer by a sputtering process, the platinum layer was heat-treated at 700° C. for 3 minutes in a nitrogen atmosphere with a heating rate of 100° C./s using an RTA system. Thereafter, the platinum layer was patterned into a predetermined shape, whereby a first electrode with a thickness of 50 nm was formed.

Next, a piezoelectric layer was formed by a procedure below.

First, a solution containing potassium 2-ethylhexanoate, sodium 2-ethylhexanoate, and niobium 2-ethylhexanoate was prepared. A precursor solution was prepared using the solution so as to have the composition $(K_{0.4}, Na_{0.6})NbO_3$.

The precursor solution was applied to the silicon substrate by a spin coating process (an application step). Thereafter, the silicon substrate was put on a hotplate and was dried at 180° C. for 4 minutes (a drying step). Next, the silicon substrate was pyrolysed at 380° C. for 4 minutes (a pyrolysing step). The silicon substrate was heat-treated at 500° C. for 3 minutes in an oxygen atmosphere with a heating rate of 100° C./s using the RTA system (a first firing step). After steps from the application step to the first firing step were repeated seven times, the silicon substrate was additionally heat-treated at 700° C. using an electric furnace (a second firing step), whereby a piezoelectric layer made of potassium sodium niobate (KNN) was prepared.

Platinum was deposited on the piezoelectric layer by a sputtering process, whereby a second electrode was formed. Thereafter, the silicon substrate was put on the hotplate and was reheated at 650° C. for 3 minutes (post-annealing), whereby a piezoelectric element was prepared.

3.1.2. Example 2

In Example 2, a piezoelectric element was prepared by substantially the same method as that used in Example 1 except that an adhesive layer was formed by depositing titanium on an insulating layer to a thickness of 10 nm by a sputtering process.

3.1.3. Example 3

In Example 3, a piezoelectric element was prepared by substantially the same method as that used in Example 2 except that a solution containing potassium 2-ethylhexanoate, sodium 2-ethylhexanoate, niobium 2-ethylhexanoate, and lithium 2-ethylhexanoate was prepared; a precursor solution containing a compound having the composition $(K_{0.4}, Na_{0.6})NbO_3$ doped with Li was prepared using the solution; and the content of Li was 10% by mole with respect to the sum of the number of moles of K and that of Na.

3.1.4. Example 4

In Example 4, a piezoelectric element was prepared by substantially the same method as that used in Example 4 except that after a platinum layer was formed on an adhesive layer by a sputtering process, a first electrode was formed without performing heat treatment and in a first firing step, a silicon substrate was heat-treated at 700° C. for 2 hours in an oxygen atmosphere with a heating rate of less than 5° C./s by furnace annealing (FA) using an electric furnace.

3.1.5. Example 5

In Example 5, a piezoelectric element was prepared by substantially the same method as that used in Example 4 except that in a first firing step, a silicon substrate was heat-treated at 800° C. for 2 hours in an oxygen atmosphere with a heating rate of less than 5° C./s by FA using an electric furnace.

3.2. Evaluation by SIMS

Figures 19, 20:
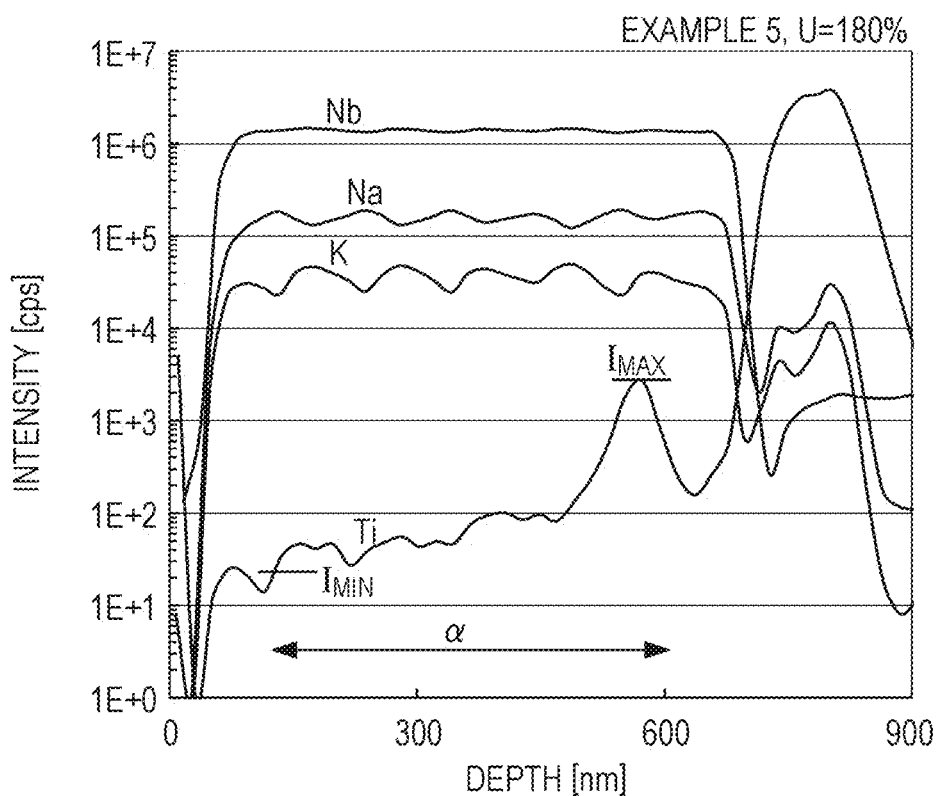
FIG. 19 is a graph showing results obtained in Example 5 by SIMS.
FIG. 20 is a table showing U-values and leakage current densities obtained in Examples 1 to 5.

In Examples 1 to 5, a U-value indicating the unevenness of Ti in a piezoelectric layer was determined by SIMS. For SIMS, a secondary ion mass spectrometer, "IMS 7F", available from CAMECA was used. FIGS. 15 to 19 are graphs showing results obtained in Examples 1 to 5, respectively, by SIMS. FIG. 20 is a table showing U-values obtained in Examples 1 to 5. Incidentally, in FIG. 20, the density of a leakage current (leakage current density) is shown (for details, refer to "3.3. Evaluation of leakage current" below).

As shown in FIGS. 15 to 20, the U-values determined in Examples 1 to 3 are lower than those in Examples 4 and 5. This shows that titanium is evenly diffused in the piezoelectric layers formed in Examples 1 to 3. In particular, in the vicinity of the interface between the piezoelectric layer and first electrode formed in each of Examples 1 to 3, the retention of titanium was not observed. This is because, in each of Examples 1 to 3, before the oxidation of titanium or the bonding of titanium with KNN was completed, titanium was diffused from the first electrode side to the second electrode side by heat treatment performed at a high heating rate by RTA after the formation of the platinum layer and before the formation of the piezoelectric layer and heat treatment performed by RTA in the first firing step.

Figure 15:
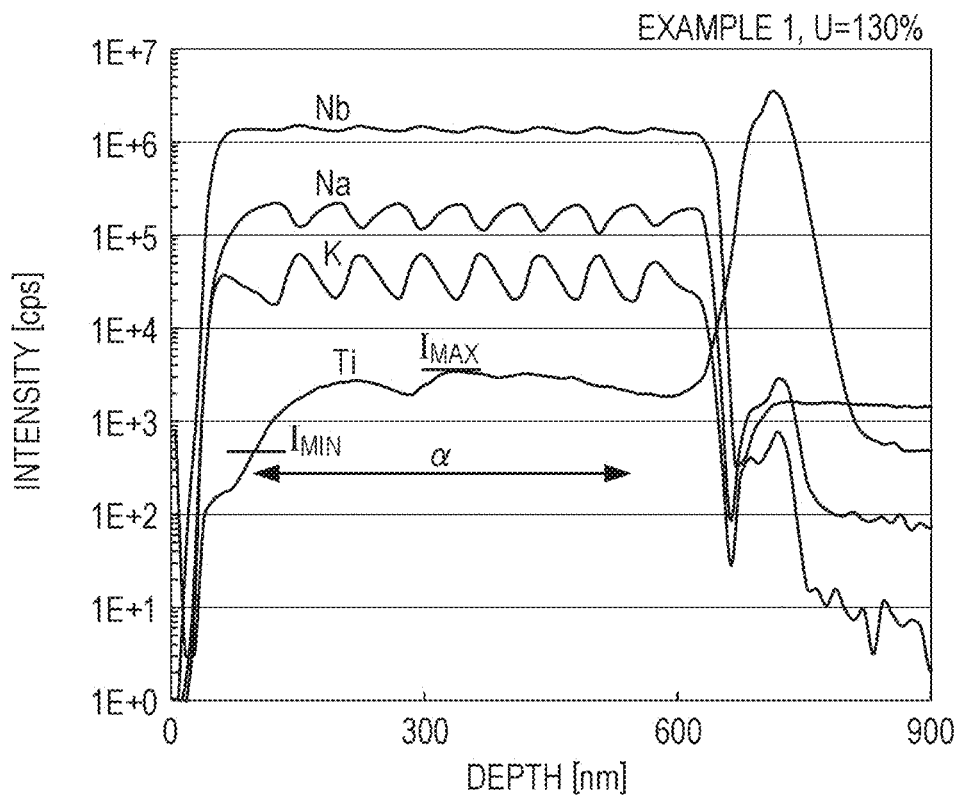
FIG. 15 is a graph showing results obtained in Example 1 by SIMS.
Figure 16:
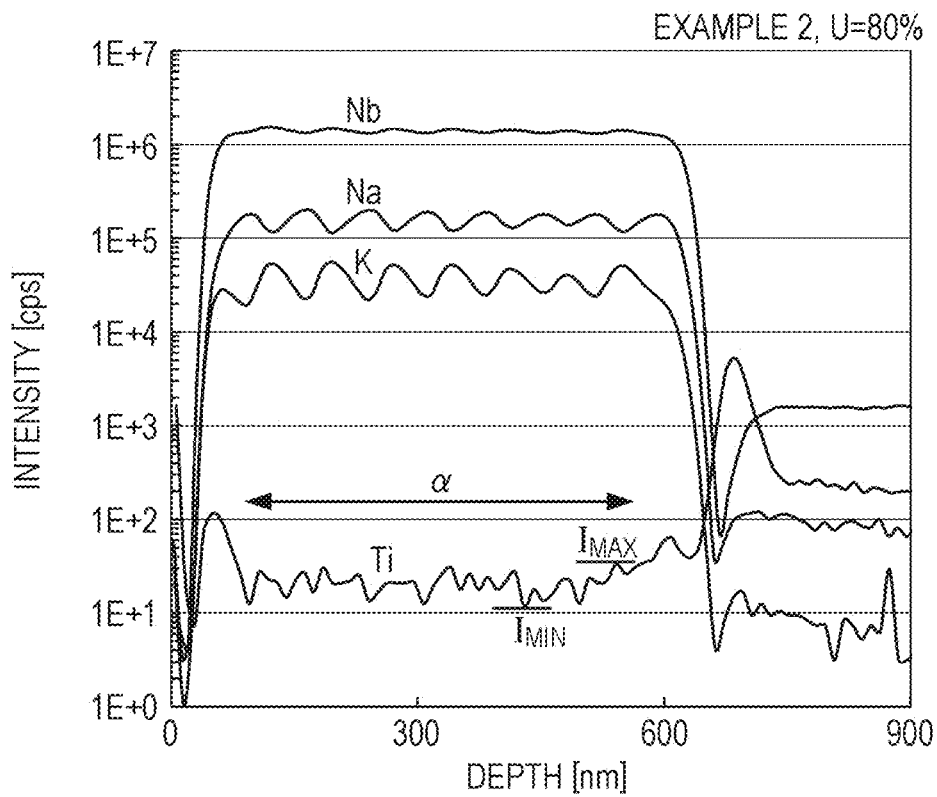
FIG. 16 is a graph showing results obtained in Example 2 by SIMS.
Figure 17:
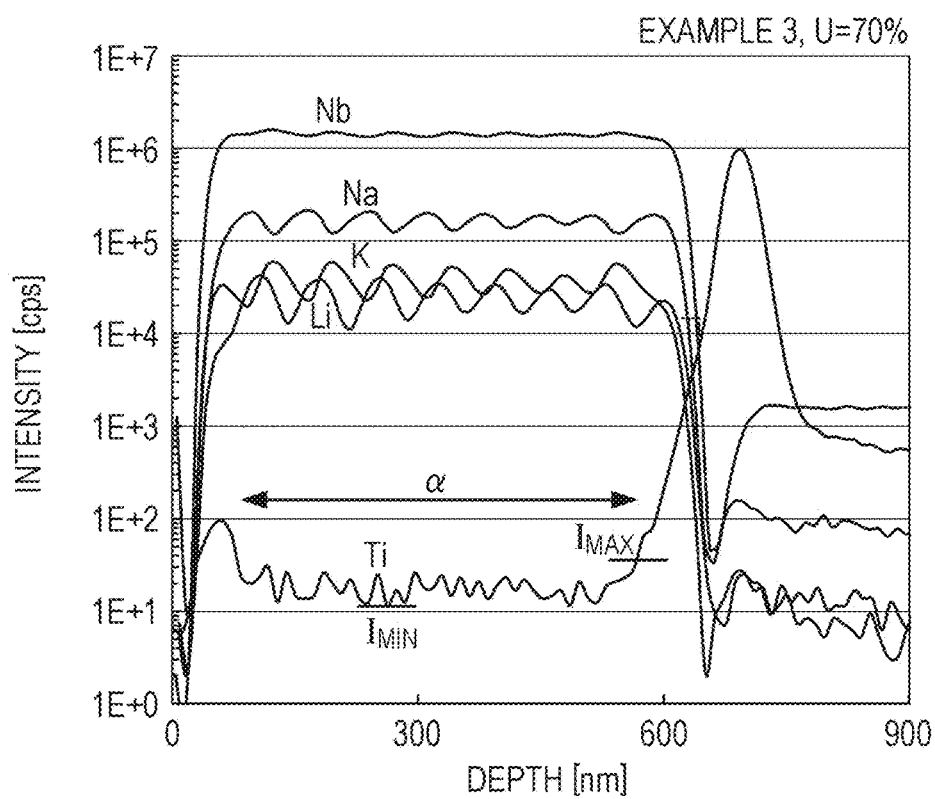
FIG. 17 is a graph showing results obtained in Example 3 by SIMS.
Figure 18:
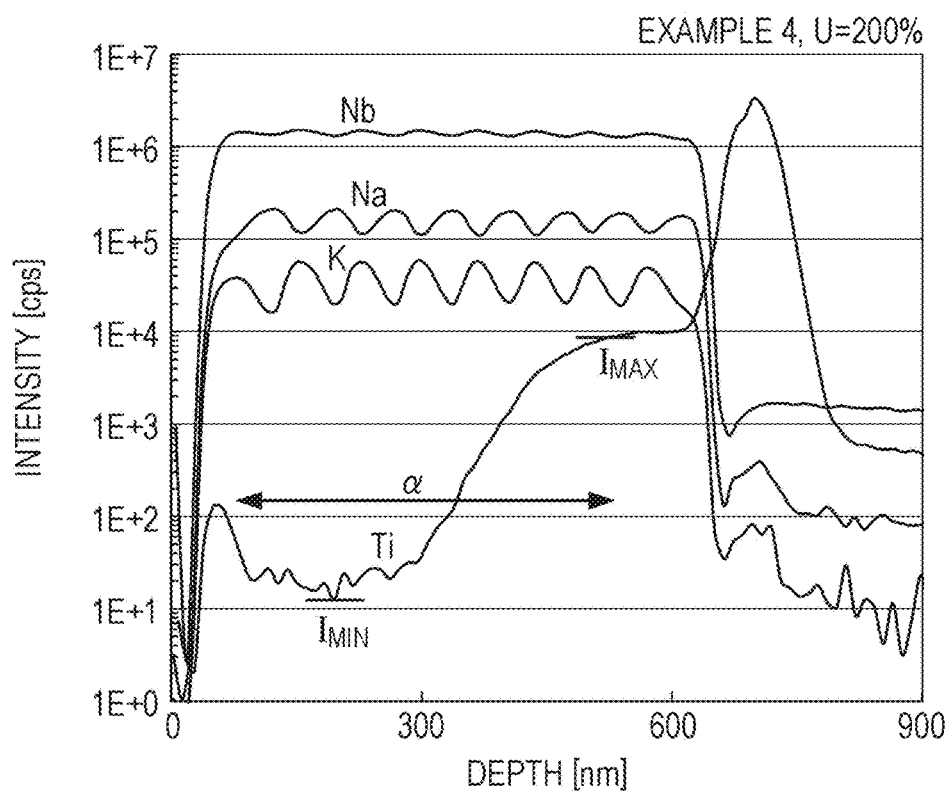
FIG. 18 is a graph showing results obtained in Example 4 by SIMS.

As shown in FIGS. 15 to 17, the intensity of a signal from titanium in the piezoelectric layer formed in each of Examples 2 and 3 is lower than that in Example 1. This is because the thickness of the titanium layer formed in each of Examples 2 and 3 is less than that in Example 1.

In Examples 4 and 5, the heating rate in the first firing step is low, less than 5° C./s. Therefore, the diffusion rate of titanium is low. Furthermore, in the first firing step, heat treatment is performed in the oxygen atmosphere and therefore before the diffusion of titanium proceeds sufficiently, the oxidation of titanium and the polymerization of titanium oxide proceed and titanium oxide begins to combine with KNN. This suppresses the diffusion of titanium, resulting in that the U-values determined in Examples 4 and 5 are higher than those in Examples 1 to 3.

Incidentally, if a first firing step is performed in a nitrogen atmosphere rather than an oxygen atmosphere, then the oxygen concentration of a piezoelectric layer is reduced and piezoelectric and dielectric characteristics are deteriorated.

In each example, the adhesive layer was a titanium layer. Even if the adhesive layer is a titanium oxide layer, a titanium carbide layer, or a titanium nitride layer, titanium in the adhesive layer diffuses into the piezoelectric layer. Titanium oxide, titanium carbide, and titanium nitride have a molecular size larger than the atomic size of titanium and a diffusion coefficient not greater than that of titanium. However, titanium has a self-diffusion coefficient substantially equal to that of lead and is the largest atom after potassium and sodium. Furthermore, potassium and sodium contained in the piezoelectric layer migrate into the adhesive layer to reduce titanium oxide, titanium carbide, or titanium nitride into titanium. Therefore, even if the adhesive layer is a titanium oxide layer, a titanium carbide layer, or a titanium nitride layer, titanium in the adhesive layer diffuses into the piezoelectric layer.

3.3. Evaluation of Leakage Current

Figure 21:
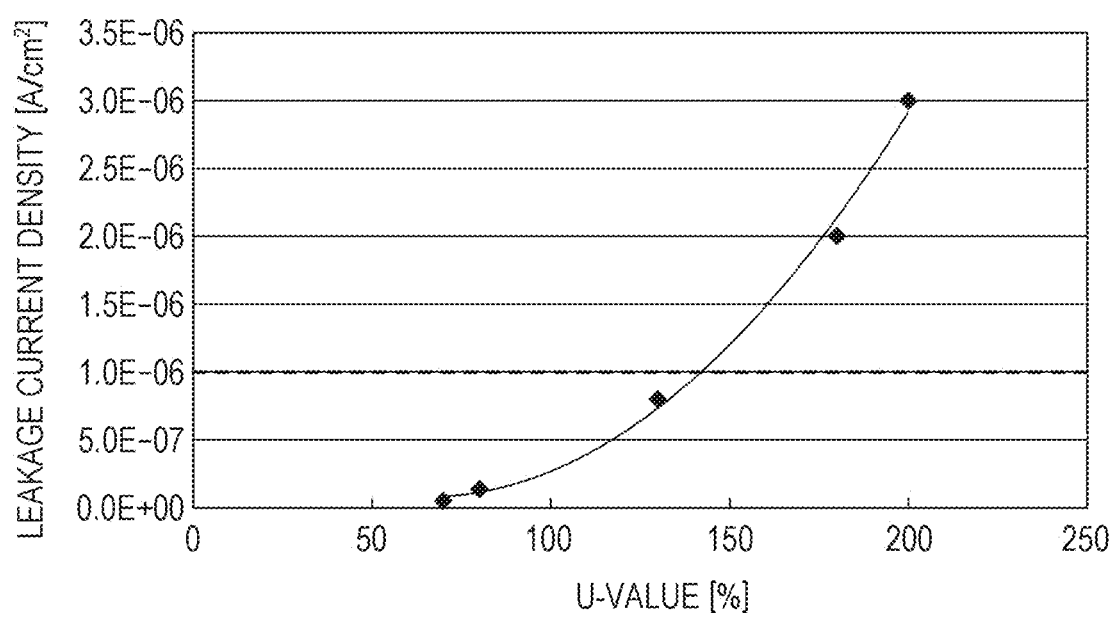
FIG. 21 is a graph showing the relationship between the U-value and leakage current density of a piezoelectric element prepared in each of Examples 1 to 5.

In Examples 1 to 5, the leakage current density was measured. In particular, in each of Examples 1 to 5, the leakage current density was measured by applying an electric field with an intensity of 200 kV/cm to the piezoelectric layer (between the first electrode and the second electrode). The leakage current density was measured using "4140B pA Meter" available from Agilent Technologies. FIG. 20 is a table showing the leakage current density of the piezoelectric element prepared in each of Examples 1 to 5. FIG. 21 is a graph showing the relationship between the U-value and the leakage current density. Incidentally, an electric field intensity of 200 kV/cm is typical electric field intensity for driving a piezoelectric element.

As is clear from FIGS. 20 and 21, as the U-value is smaller, the leakage current density is lower. That is, as titanium is more evenly diffused in a piezoelectric layer, the leakage current is smaller. When the U-value is 140% or less, the leakage current density can be suppressed to $1 \times 10^{-6}$ A/cm$^2$ or less. The leakage current density determined in each of Examples 1 to 3 is less than $1 \times 10^{-6}$ A/cm$^2$.

The piezoelectric layer, formed in Example 3, containing lithium has a leakage current density lower than that of the piezoelectric layer, formed in Example 2, containing no lithium. Thus, the leakage current can be reduced by allowing a piezoelectric layer to contain lithium.

In Comparative Example 1, a piezoelectric element was prepared by substantially the same method as that used in Example 1 except that no adhesive layer (titanium layer) was formed, no heat treatment by RTA was performed before a first electrode was formed, and the thickness of the first electrode was 100 nm.

Figure 22:
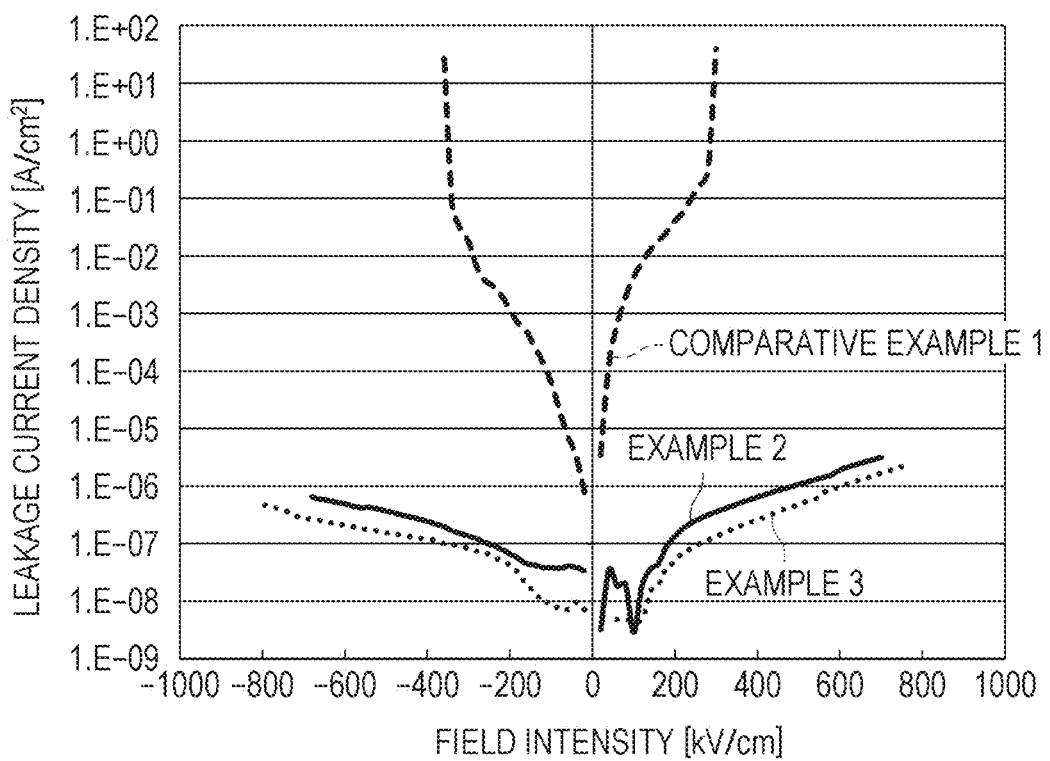
FIG. 22 is a graph showing the relationship between the electric field intensity in the piezoelectric element prepared in each of Examples 2 and 3 and Comparative Example 1 and the leakage current density thereof.

FIG. 22 is a graph showing the relationship between the electric field intensity in the piezoelectric element prepared in each of Examples 2 and 3 and Comparative Example 1 and the leakage current density thereof.

As shown in FIG. 22, the piezoelectric layer, formed in each of Examples 2 and 3, containing Ti has a leakage current density lower than that of the piezoelectric layer, formed in Comparative Example 1, containing no Ti. Thus, the leakage current can be reduced by allowing a piezoelectric layer to contain Ti.

Referring to FIG. 22, a region where the electric field intensity is positive indicates that the potential of a first electrode is higher than the potential of a second electrode and a region where the electric field intensity is negative indicates that the potential of the first electrode is lower than the potential of the second electrode. The driving of a piezoelectric element does not depend on whether the potential is positive or negative. The experiment examples focused on the leakage current density when the first potential was positive. Asymmetry due to the polarity (positive or negative) of the first potential, that is, the difference between leakage currents is derived from a discrepancy in an interfacial structure formed by a piezoelectric and an electrode. Strictly speaking, the difference due to a discrepancy in an interfacial structure is present. However, there is substantially no difference between leakage currents due to the structure of a piezoelectric layer, that is, the composition of the piezoelectric layer. In the experiment examples, the case where the segment potential was positive was used to evaluate currents.

3.4. Influence of Heat Treatment after Formation of First Electrode

The influence of heat treatment after the formation of a first electrode (heat treatment after the formation of a platinum layer on an adhesive layer by a sputtering process and before the patterning of the platinum layer) was investigated. In Example 6, a piezoelectric element was prepared by substantially the same method as that used in Example 1 except that the heat treatment temperature was 600° C. In Example 7, a piezoelectric element was prepared by substantially the same method as that used in Example 1 except that the heat treatment temperature was 650° C. In Example 8, a piezoelectric element was prepared by substantially the same method as that used in Example 1 except that the heat treatment temperature was 700° C. In Example 9, a piezoelectric element was prepared by substantially the same method as that used in Example 1 except that the heat treatment temperature was 750° C. In Example 10, a piezoelectric element was prepared by substantially the same method as that used in Example 1 except that the heat treatment temperature was 800° C. In Example 11, a piezoelectric element was prepared by substantially the same method as that used in Example 1 except that no heat treatment was performed.

Figure 24:
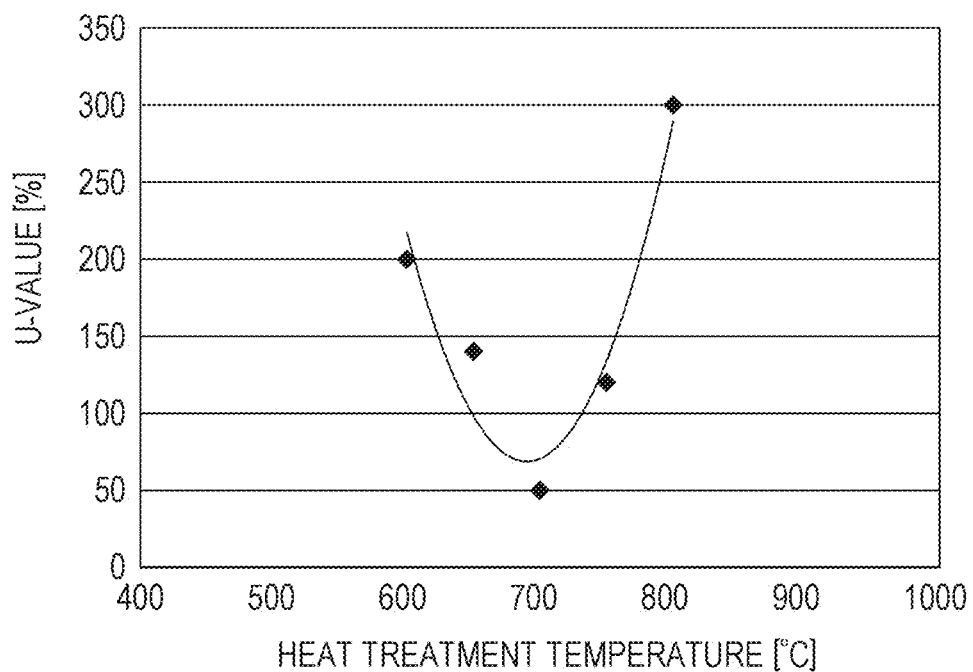
FIG. 24 is a graph showing the relationship between the heat treatment temperature and the U-value.
Figure 25:
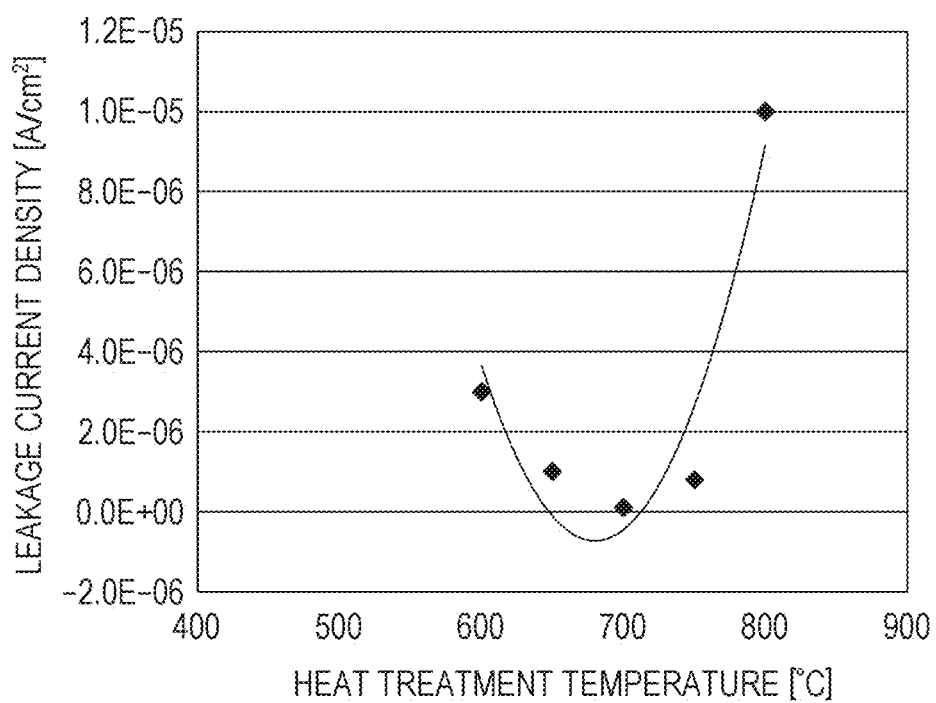
FIG. 25 is a graph showing the relationship between the heat treatment temperature and the leakage current density.

In Examples 6 to 11, the U-value was determined in the same manner as that described in "3.2. Evaluation by SIMS". Furthermore, in Examples 6 to 11, the leakage current density was determined in the same manner as that described in "3.3. Evaluation of leakage current". FIG. 23 is a table showing heat treatment temperatures, U-values, and leakage current densities. FIG. 24 is a graph showing the relationship between the heat treatment temperature and the U-value. FIG. 25 is a graph showing the relationship between the heat treatment temperature and the leakage current density.

As shown in FIGS. 23 to 25, in Examples 6 to 11, when the heat treatment temperature is 700° C., the U-value is least and the leakage current density is lowest. As shown in FIGS. 23 to 25, the leakage current density can be lowered to $1\times10^{-6}$ A/cm$^2$ or less by setting the heat treatment temperature to 650° C. to 750° C.

3.5. Evaluation by STEM-EDS

The distribution of titanium in Examples 3 and 12 was investigated by scanning transmission electron microscopy combined with energy dispersive X-ray spectroscopy (STEM-EDS).

In Example 12, a piezoelectric element was prepared by substantially the same method as that used in Example 3 except that after a platinum layer was formed on an adhesive layer by a sputtering process, a first electrode was formed without heat treatment and in a first firing step, a silicon substrate was heat-treated at 700° C. for 2 hours in an oxygen atmosphere with a heating rate of less than 5° C./s by FA using an electric furnace.

Figure 26:
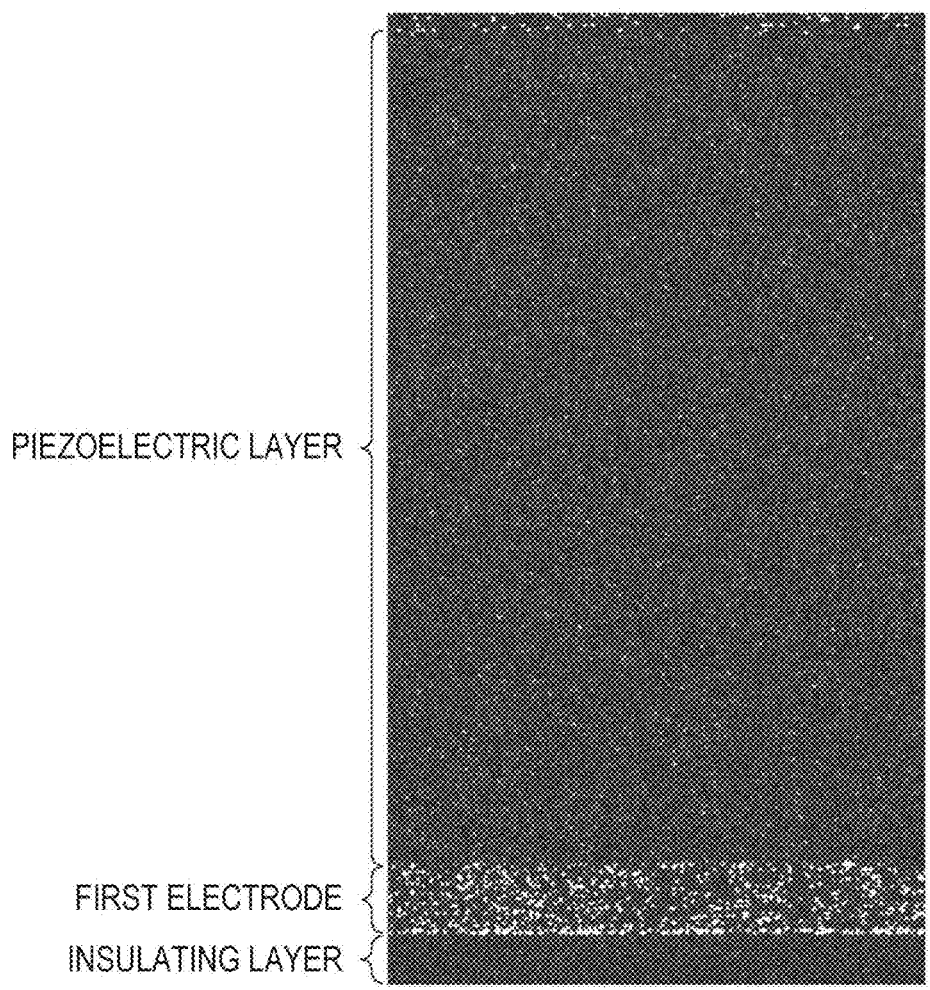
FIG. 26 is an illustration showing results obtained by STEM-EDS in Example 3.
Figure 27:
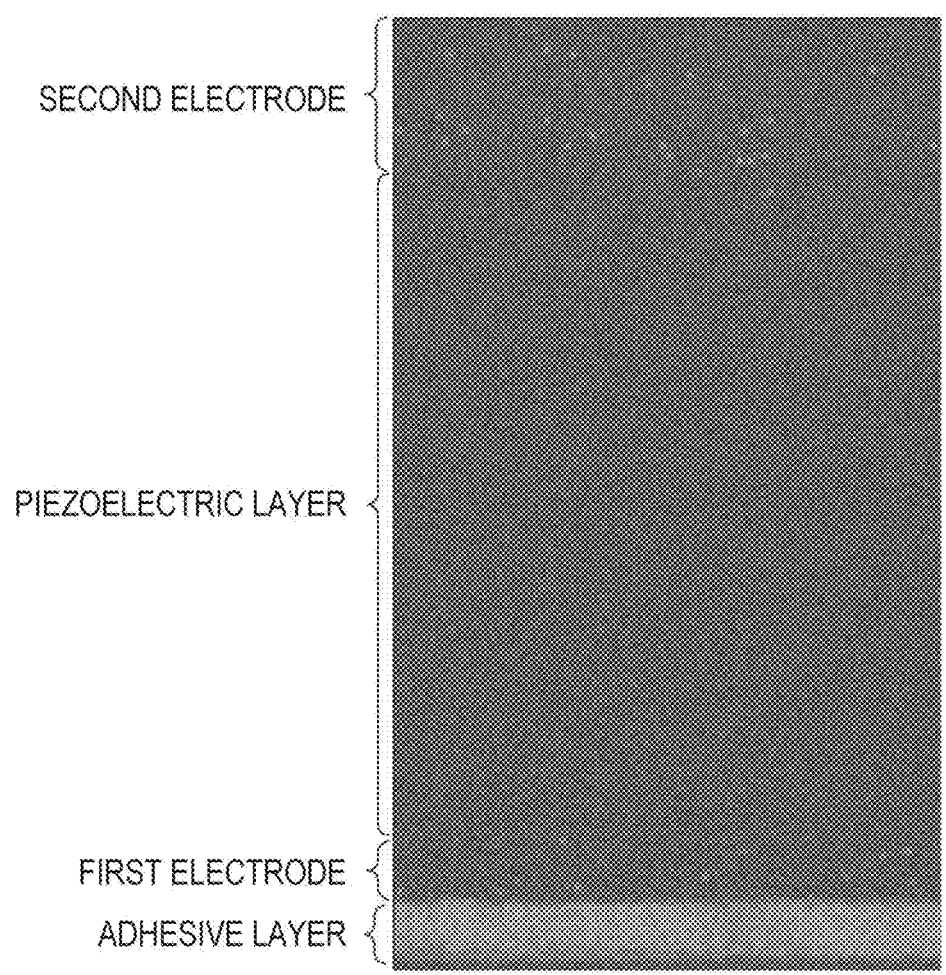
FIG. 27 is an illustration showing results obtained by STEM-EDS in Example 12.

FIG. 26 shows results obtained by STEM-EDS in Example 3. FIG. 27 shows results obtained by STEM-EDS in Example 12. Referring to FIGS. 26 and 27, titanium is shown in white. As is clear from FIGS. 26 and 27, titanium is more evenly diffused in the piezoelectric layer formed in Example 3 as compared to that in Example 12. The results obtained by STEM-EDS show that titanium is evenly diffused into a piezoelectric layer by heat treatment after the formation of a platinum layer on an adhesive layer by a sputtering process and before the patterning of the platinum layer and heat treatment by RTA in a first firing step.

The invention may omit some of configurations or may combine embodiments and modifications as long as the invention has features and advantages described herein.

The invention includes configurations substantially the same as the configurations described in the embodiments (for example, configurations that are the same in function, method, and result or configurations that are the same in object and effect). The invention also includes configurations obtained by replacing non-essential portions of the configurations described in the embodiments. The invention also includes configurations that can exhibit the same effects as those described in the embodiments or configurations that can achieve the same objects as those described in the embodiments. Further, the invention includes configurations obtained by adding a known technique to the configurations described in the embodiments.

What is claimed is:
1. A piezoelectric element comprising:
a first electrode;
a piezoelectric layer, placed on or above the first electrode, containing a perovskite-type composite oxide including potassium, sodium, and niobium; and
a second electrode placed on or above the piezoelectric layer,
wherein the piezoelectric layer further includes titanium, and wherein an unevenness of titanium in the piezoelectric layer is indicated by a U-value and the U-value is 140% or less and satisfies a formula as follows:

$$U=\{2\times(I_{MAX}-I_{MIN})/(I_{MAX}+I_{MIN})\}\times 100$$

where $I_{MAX}$ is a maximum intensity of a signal from the titanium in a predetermined zone of the piezoelectric layer as analyzed from a side of the piezoelectric layer facing the second electrode side in a depth direction by secondary ion mass spectroscopy and $I_{MIN}$ is a minimum intensity of the signal from the titanium in the predetermined zone of the piezoelectric layer as analyzed from the side of the piezoelectric layer facing the second electrode side in the depth direction by secondary ion mass spectroscopy.

2. The piezoelectric element according to claim 1, wherein the piezoelectric layer is predominantly oriented a (100), (110), or (111) plane.

3. The piezoelectric element according to claim 1, wherein a composition of the perovskite-type composite oxide in the piezoelectric layer satisfies a formula as follows:

$$(K_x,Na_{1-x})_A NBO_3$$

where $0.1 \leq x \leq 0.9$ and $0.85 \leq A \leq 1.15$.

4. The piezoelectric element according to claim 1, wherein the composition of the composite oxide in the piezoelectric layer satisfies the following formula:

$$(K_x,Na_{1-x})_A NBO_3$$

where $0.35 \leq x \leq 0.55$ and $0.85 \leq A \leq 1.15$.

5. The piezoelectric element according to claim 1, wherein a content of the titanium in the piezoelectric layer is 20% by mole or less and 3% by mole or more with respect to a number of moles of the niobium in the piezoelectric layer.

6. The piezoelectric element according to claim 1, wherein the piezoelectric layer contains lithium and a content of the lithium is 20% by mole or less with respect to a sum of a number of moles of the potassium and that of the sodium.

7. A piezoelectric element-applied device comprising the piezoelectric element according to claim 1.

8. The piezoelectric element according to claim 1, wherein at least one of the first electrode and the second electrode contains titanium.

9. A piezoelectric element-applied device comprising the piezoelectric element according to claim 8.

10. The piezoelectric element according to claim 1, wherein a density of a leakage current is $1\times 10^{-6}$ A/cm$^2$ or less when an electric field with an intensity of 200 kV/cm is applied to the piezoelectric layer.

11. A piezoelectric element-applied device comprising the piezoelectric element according to claim 10.

12. The piezoelectric element according to claim 1, wherein the U-value is in a range of 70% and 140%.

13. A piezoelectric element-applied device comprising the piezoelectric element according to claim 12.

14. A method for manufacturing a piezoelectric element, comprising:
forming a first electrode;
forming a piezoelectric layer containing a perovskite-type composite oxide including potassium, sodium and niobium, and titanium on or above the first electrode; and
forming a second electrode on or above the piezoelectric layer,
wherein an unevenness of titanium in the piezoelectric layer is indicated by a U-value and the U-value is 140% or less and satisfies a formula as follows:

$$U=\{2\times(I_{MAX}-I_{MIN})/(I_{MAX}+I_{MIN})\}\times 100$$

where $I_{MAX}$ is a maximum intensity of a signal from the titanium in a predetermined zone of the piezoelectric layer as analyzed from a side of the piezoelectric layer facing the second electrode side in a depth direction by secondary ion mass spectroscopy and $I_{MIN}$ is a minimum intensity of the signal from the titanium in the predetermined zone of the piezoelectric layer as analyzed from the side of the piezoelectric layer facing the second electrode side in the depth direction by secondary ion mass spectroscopy.

15. The method according to claim 14, further comprising:
forming a layer containing titanium before forming the first electrode; and
heat-treating the layer containing titanium at a temperature of 650° C. to 750° C. after forming the first electrode and before forming the piezoelectric layer,
wherein forming the piezoelectric layer includes firing.

16. The method according to claim 14, further comprising:
the heat-treating the layer containing titanium at a temperature of 650° C. to 750° C. in a nitrogen atmosphere.

* * * * *